(12) United States Patent
Kushibe et al.

(10) Patent No.: US 7,426,228 B2
(45) Date of Patent: Sep. 16, 2008

(54) SURFACE EMITTING TYPE OPTICAL SEMICONDUCTOR DEVICE

(75) Inventors: Mitsuhiro Kushibe, Tokyo (JP); Mizunori Ezaki, Yokohama (JP); Rei Hashimoto, Tokyo (JP); Michihiko Nishigaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 11/387,315

(22) Filed: Mar. 23, 2006

(65) Prior Publication Data

US 2007/0047607 A1     Mar. 1, 2007

(30) Foreign Application Priority Data

Mar. 31, 2005  (JP) .............................. 2005-102036

(51) Int. Cl.
*H01S 5/00*  (2006.01)
(52) U.S. Cl. ............................. 372/46.01; 372/46.013; 372/46.015; 372/50.124
(58) Field of Classification Search ............. 372/46.01, 372/46.013, 46.015, 50.124
See application file for complete search history.

(56) References Cited

U.S. PATENT DOCUMENTS

2004/0213311 A1* 10/2004 Johnson et al. ............... 372/45

FOREIGN PATENT DOCUMENTS

| JP | 10-056233 | 2/1998 |
|---|---|---|
| JP | 2000-022271 | 1/2000 |

OTHER PUBLICATIONS

K. H. Hahn, et al., Modal and Intensity Noise of Large-Area Multiple-Transverse-Mode VCSELs in Multimode-Opitcal-Fiber Links, OFC 94 Technical Digest, pp. 183-184.

* cited by examiner

*Primary Examiner*—Minsun Harvey
*Assistant Examiner*—Yuanda Zhang
(74) *Attorney, Agent, or Firm*—Amin, Turocy & Calvin, LLP

(57) ABSTRACT

It makes possible to inject a current into the current confinement region substantially uniformly. A surface emitting type optical semiconductor device includes a semiconductor active layer provided above a substrate; a first and second reflecting mirror layers sandwiching the semiconductor active layer to form an optical cavity in a direction perpendicular to the substrate; a plurality of current confinement regions provided in the second reflecting mirror layer so as to be separated by an impurity region having impurities; a semiconductor current diffusion layer provided on the second reflecting mirror layer so as to cover the current confinement regions; and an electrode portion which injects a current into the semiconductor active layer. The electrode portion comprising a first electrode provided on the semiconductor current diffusion layer so as to surround the current confinement regions and a second electrode provided on an opposite side of the substrate from the semiconductor active layer.

7 Claims, 5 Drawing Sheets

SURFACE EMITTING TYPE OPTICAL SEMICONDUCTOR DEVICE

CROSS-REFERENCE TO RELATED APPLICATION

This application is based upon and claims the benefit of priority from prior Japanese Patent Application No. 2005-102036 filed on Mar. 31, 2005 in Japan, the entire contents of which are incorporated herein by reference.

BACKGROUND OF THE INVENTION

1. Field of the Invention

The present invention relates to a surface emitting type optical semiconductor device. In particular, the present invention relates to a surface emitting type optical semiconductor device of vertical resonator type having a current confinement structure separated by an impurity region.

2. Related Art

In recent years, optical data transmission using an optical semiconductor device utilizing compound semiconductors for Groups III-V as a light source has been widely put to practical use. As its transmission line, a fiber utilizing silica, a fiber utilizing polymers, or spatial transmission is used. As its light source, a surface emitting type optical semiconductor device such as a surface emitting type laser or a light emitting diode of optical cavity type which is advantageous in optical coupling to fibers and cost reduction is used.

However, the conventional surface emitting type optical semiconductor device has a problem of low optical output. This problem has become especially remarkable in recent years because it is necessary to raise the optical output as the transmission rate is increased. Especially, in the surface emitting type laser, it is necessary to reduce a diameter of the current confinement portion in order to obtain high optical stability in the lateral mode. This becomes a restriction factor in increasing the optical output.

Furthermore, for increasing the optical output in a surface emitting type laser having a small device size, it is necessary to raise the injection current density. If it is attempted to increase the optical output, heat is generated in a narrow region and the temperature is apt to rise. This results in a problem that the device characteristics are degraded by the heat generation. For solving these problems, it is indispensable to lower the device resistance.

In the conventional surface emitting type optical semiconductor device of ion implantation type, a high resistance region is formed by injecting protons from the crystal surface into the outside of a region serving as a current confinement region. As a result, the current confinement region in which a current is confined is formed inside the high resistance region. At this time, it is necessary to form a contact electrode on a surface corresponding to the current confinement region inside the region raised in resistance by injecting protons. In an example of a surface emitting type laser having such a configuration, a substrate side semiconductor multilayer film reflecting mirror layer is provided on a GaAs substrate. An active layer including quantum wells and spacers is provided on the substrate side semiconductor multilayer film reflecting mirror layer. In addition, a p-side electrode opened so as to provide an aperture of laser emission region with a predetermined value is provided on a surface side semiconductor multilayer film reflecting mirror layer. Furthermore, a high resistance region formed by proton injection is provided in a peripheral part of the surface side semiconductor multilayer film reflecting mirror layer in order to define a current injection region (current confinement region) to the active layer.

As for the p-side electrode in this surface emitting type laser, an ohmic junction is formed on the surface inside the surface of the high resistance region formed by proton injection as described above. This results in a problem that the optical output is lowered by the p-side electrode metal and a problem that the injected current quantity must be increased by widening the current confinement region more than needed. Furthermore, since the contact area cannot be made large, it is also difficult to make the contact resistance small. Especially in this example, it is necessary to set the aperture of the laser emission port to a small value in order to control the lateral mode. Therefore, it is extremely difficult to make the contact area large.

For example, Japanese Patent Application Laid-Open Publication No. 2000-22271 exemplifies a device formed by forming a high resistance region on the side parts of a semiconductor multilayer film reflecting mirror (hereafter referred to as DBR (distributed Bragg reflector) as well) in a surface emitting type laser using ion implantation and inside of the high resistance region is used as a current confinement region. This technique has improved the controllability of the basic mode in a surface emitting type laser having a single mode, and study from the viewpoint of the device resistance is not conducted. As regards the device resistance, neither a concrete relevant device structure nor its manufacturing method is described. There is only description that ions are implanted into the side parts of the DBR. Therefore it is considered that ions are implanted from the top. Therefore, it is considered that the resistance of the DBR of an upper part of the ion implantation region and a second adjustment layer formed on the DBR becomes high. This point can be guessed from that the inside diameter of an electrode provided on the second adjustment layer is smaller than the inside diameter of the ion implantation region. Because if the inside diameter of the electrode is made larger than the inside diameter of the ion implantation region, the electrode comes in contact with only a portion raised in resistance by ion implantation and the device resistance becomes great. As a result, it becomes difficult to let flow a sufficient current or heat generation increases, resulting in a lowered optical output. If the inside diameter of the electrode is made smaller than the inside diameter of the ion implantation region as described in Japanese Patent Application Laid-Open Publication No. 2000-22271, the electrode intercepts light, resulting in a problem of an insufficient laser optical output.

Furthermore, for example, in a first embodiment described in Japanese Patent Application Laid-Open Publication No. 10-56233, a high-resistance low-reflection zone using ion implantation is provided in an upper mirror, and a loss determining device is formed in an upper part of the high-resistance low-reflection zone by using epitaxial growth. If such a configuration is used, design that prevents the resistance at an electrode junction portion from increasing and optical absorption conducted by the electrode from exerting influence becomes possible. However, there is no concrete description as regards the electrical resistance of the loss determining device. It is described that it is desirable to set the resistance equal to substantially zero. Since the loss determining device is formed of GaAs, the impurity concentration is increased to the utmost limit to lower the resistance. If the device is produced on the basis of such a thought, then the carrier concentration of a compound semiconductor is high and consequently the optical absorption coefficient becomes large, resulting in a problem of an increased optical loss. Because of the position relation between the electrode and the core zone, current injection is apt to occur in a periphery portion of the core zone as compared with the inside of the core zone. In the case of laser operation, the fundamental mode is apt to become unstable. In another embodiment described in Japanese Patent Application Laid-Open Publication No. 10-56233, a current diffusion layer is provided. Since it is described that the resistance is made low as far as possible, however, it cannot be avoided that the optical loss is increased by the current diffusion layer.

When the surface emitting type laser is made to operate with a high optical output, it is necessary to inject a large current into a narrow region. Therefore, it is not easy to make the optical output of the surface emitting type laser high. Especially when the surface emitting type laser is made to operate at a high frequency, it is necessary to inject a current into the narrow region and obtain a high optical output. Since in this case the current is injected into the narrow region, the device resistance becomes high and generated heat increases. Since heat is generated in the narrow region, the device temperature is apt to rise and the optical output is lowered. Therefore, it becomes necessary to conduct further current injection. This results in a problem that a vicious cycle occurs.

Furthermore, even if a diameter of the current confinement region is made large in order to increase the optical output, it is difficult to inject a current uniformly into the current confinement region. Rather, the current density in the central part of the device falls and the optical output becomes non-uniform. This results in a problem that the optical mode becomes unstable.

SUMMARY OF THE INVENTION

In view of the above-described circumstances, the present invention has been achieved.

An object of the present invention is to provide a surface emitting type optical semiconductor device capable of injecting a current into the current confinement region substantially uniformly.

A surface emitting type optical semiconductor device according to a first aspect of the present invention includes: a substrate; a first reflecting mirror layer provided on the substrate and having a first semiconductor multilayer film; a semiconductor active layer provided above the first reflecting mirror layer and having a light emitting region; a second reflecting mirror layer provided above the semiconductor active layer and having a second semiconductor multilayer film, the first and second reflecting mirror layers forming an optical cavity in a direction perpendicular to the substrate; a plurality of current confinement regions provided in the second reflecting mirror layer so as to be separated by an impurity region having impurities, each of the current confinement regions having a current confining path; a semiconductor current diffusion layer provided on the second reflecting mirror layer so as to cover the current confinement regions; and an electrode portion which injects a current into the semiconductor active layer, the electrode portion comprising a first electrode provided on the semiconductor current diffusion layer so as to surround the current confinement regions and a second electrode provided on an opposite side of the substrate from the semiconductor active layer.

The current confinement regions can be arranged so as to increase in device resistance for injecting currents with the increase of the distance from a center of a region surrounding the current confinement regions toward outside.

The current confinement regions can be arranged concentrically around a center of a region surrounding the current confinement regions.

The semiconductor current diffusion layer can have a stacked structure of a plurality of semiconductor current diffusion films, and the semiconductor current diffusion film located nearer the semiconductor active layer can be formed so as to have higher resistance in a peripheral part located far from a center of the region surrounding the current confinement regions as compared with a central part located near the center of the region surrounding the current confinement regions and so as to have higher resistance in the peripheral part as compared with the semiconductor current diffusion film located far from the semiconductor active layer and.

The semiconductor current diffusion layer can have a stacked structure of a plurality of semiconductor current diffusion films, and the semiconductor current diffusion film located nearer the semiconductor active layer can be formed so as to have a greater thickness in a peripheral part located far from a center of a region surrounding the current confinement regions as compared with a central part located near the center of the region surrounding the current confinement regions.

A minimal radius r μm of a region surrounding the current confinement regions and a film thickness s μm of the semiconductor current diffusion layer can satisfy relations $$s < 5\sqrt{r}$$

and $$s > ((\sqrt{2}-1)/2) \times r.$$

The semiconductor current diffusion layer can be provided so as to be in contact with the current confinement regions.

A thickness of the impurity region can be greater than a minimal radius of the region surrounding the current confinement regions.

A third reflecting mirror layer having a third semiconductor multilayer film can be provided between the semiconductor current diffusion layer and the second reflecting mirror layer.

A surface emitting type optical semiconductor device according to a second aspect of the present invention includes: a substrate; a first reflecting mirror layer provided on the substrate and having a first semiconductor multilayer film; a semiconductor active layer provided above the first reflecting mirror layer and having a light emitting region; a second reflecting mirror layer provided above the semiconductor active layer and having a second semiconductor multilayer film, the first and second reflecting mirror layers forming an optical cavity in a direction perpendicular to the substrate; a current confinement region provided in the second reflecting mirror layer so as to be surrounded by an impurity region having impurities, the current confinement region having current confining paths; a semiconductor current diffusion layer provided on the second reflecting mirror layer so as to cover the current confinement region, the semiconductor current diffusion layer having a stacked structure of first and second semiconductor current diffusion films, the first semiconductor current diffusion film being located nearer the semiconductor active layer than the second semiconductor current diffusion film, the first semiconductor current diffusion film being formed so as to have higher resistance in a peripheral part located far from a center of the current confinement region as compared with a central part located near the center of the current confinement region and so as to have higher resistance in the peripheral part as compared with the second semiconductor current diffusion film; and an electrode portion which injects a current into the semiconductor active layer, the electrode portion comprising a first electrode provided on the semiconductor current diffusion layer so as to surround the current confinement region and a second electrode provided on an opposite side of the substrate from the semiconductor active layer.

The current confinement region can include a plurality of regions.

The first semiconductor current diffusion film can be formed so as to have a greater thickness in the peripheral part as compared with the central part located near the center of the current confinement region.

A minimal radius r μm of the current confinement region and a film thickness s μm of the semiconductor current diffusion layer can satisfy relations $$s < 5\sqrt{r}$$

and $$s > ((\sqrt{2}-1)/2) \times r.$$

A thickness of the impurity region can be greater than a radius of the current confinement region.

The semiconductor current diffusion layer can be provided so as to be in contact with the current confinement region.

A third reflecting mirror layer having a third semiconductor multilayer film can be provided between the semiconductor current diffusion layer and the second reflecting mirror layer.

A surface emitting type optical semiconductor device according to a third aspect of the present invention includes: a substrate; a first reflecting mirror layer provided on the substrate and having a first semiconductor multilayer film; a semiconductor active layer provided above the first reflecting mirror layer and having a light emitting region; a second reflecting mirror layer provided above the semiconductor active layer and having a second semiconductor multilayer film, the first and second reflecting mirror layers forming an optical cavity in a direction perpendicular to the substrate; a current confinement region provided in the second reflecting mirror layer so as to be surrounded by an impurity region having impurities, the current confinement region having current confining paths; a semiconductor current diffusion layer provided on the second reflecting mirror layer so as to cover the current confinement region, the semiconductor current diffusion layer having a stacked structure of first and second semiconductor current diffusion films, the first semiconductor current diffusion film being located nearer the semiconductor active layer than the second semiconductor current diffusion film, the first semiconductor current diffusion film being formed so as to have a greater thickness in a peripheral part located far from a center of the current confinement region as compared with a central part located near the center of the current confinement region; and an electrode portion which injects a current into the semiconductor active layer, the electrode portion comprising a first electrode provided on the semiconductor current diffusion layer so as to surround the current confinement region and a second electrode provided on an opposite side of the substrate from the semiconductor active layer.

The current confinement region can include a plurality of regions.

The current confinement regions can be arranged so as to increase in device resistance for injecting currents with the increase of the distance from a center of a region surrounding the current confinement regions toward outside.

A minimal radius r μm of the current confinement region and a film thickness s μm of the semiconductor current diffusion layer can satisfy relations $$s < 5\sqrt{r}$$

and $$s > ((\sqrt{2}-1)/2) \times r.$$

A thickness of the impurity region can be greater than a radius of the current confinement region.

The semiconductor current diffusion layer can be provided so as to be in contact with the current confinement region.

A third reflecting mirror layer having a third semiconductor multilayer film can be provided between the semiconductor current diffusion layer and the second reflecting mirror layer.

A surface emitting type optical semiconductor device according to fourth aspect of the present invention includes: a substrate; a first reflecting mirror layer provided on the substrate and having a first semiconductor multilayer film; a semiconductor active layer provided above the first reflecting mirror layer and having a light emitting region; a second reflecting mirror layer provided above the semiconductor active layer and having a second semiconductor multilayer film, the first and second reflecting mirror layers forming an optical cavity in a direction perpendicular to the substrate; a current confinement region provided in the second reflecting mirror layer so as to be surrounded by an impurity region having impurities, the current confinement region having current confining paths; a semiconductor current diffusion layer provided on the second reflecting mirror layer so as to cover the current confinement region; and an electrode portion which injects a current into the semiconductor active layer, the electrode portion comprising a first electrode provided on the semiconductor current diffusion layer so as to surround the current confinement region and a second electrode provided on an opposite side of the substrate from the semiconductor active layer, a minimal radius r μm of the current confinement region and a film thickness s μm of the semiconductor current diffusion layer satisfying relations $$s < 5\sqrt{r}$$

and $$s > ((\sqrt{2}-1)/2) \times r.$$

The current confinement region can include a plurality of regions.

The semiconductor current diffusion layer can have a stacked structure of a plurality of semiconductor current diffusion films, and the semiconductor current diffusion film located nearer the semiconductor active layer is formed so as to have higher resistance in a peripheral part located far from a center of the region surrounding the current confinement regions as compared with a central part located near the center of the region surrounding the current confinement regions and so as to have higher resistance in the peripheral part as compared with the semiconductor current diffusion film located farther from the semiconductor active layer.

The semiconductor current diffusion layer can have a stacked structure of a plurality of semiconductor current diffusion films, and the semiconductor current diffusion film located nearer the semiconductor active layer can be formed so as to have a greater thickness in a peripheral part located far from a center of a region surrounding the current confinement regions as compared with a central part located near the center of the region surrounding the current confinement regions.

A thickness of the impurity region can be greater than a radius of the current confinement region.

The semiconductor current diffusion layer can be provided so as to be in contact with the current confinement region.

A third reflecting mirror layer having a third semiconductor multilayer film can be provided between the semiconductor current diffusion layer and the second reflecting mirror layer.

A surface emitting type optical semiconductor device according to a fifth aspect of the present invention include: a substrate; a first reflecting mirror layer provided on the substrate and having a first semiconductor multilayer film; a semiconductor active layer provided above the first reflecting mirror layer and having a light emitting region; and a second reflecting mirror layer provided above the semiconductor active layer and having a second semiconductor multilayer film, the first and second reflecting mirror layers forming an optical cavity in a direction perpendicular to the substrate; a current confinement region provided in the second reflecting mirror layer so as to be surrounded by an impurity region having impurities, the current confinement region having current confining paths; a semiconductor current diffusion layer provided on the second reflecting mirror layer so as to cover the current confinement region; and an electrode portion which injects a current into the semiconductor active layer, the electrode portion comprising a first electrode provided on the semiconductor current diffusion layer so as to surround the current confinement region and a second electrode provided on an opposite side of the substrate from the semiconductor active layer, a thickness of the impurity region being greater than a radius of the current confinement region.

The current confinement region can include a plurality of regions.

The semiconductor current diffusion layer can have a stacked structure of a plurality of semiconductor current diffusion films, and the semiconductor current diffusion film located nearer the semiconductor active layer is formed so as to have higher resistance in a peripheral part located far from a center of the region surrounding the current confinement regions as compared with a central part located near the center of the region surrounding the current confinement regions and so as to have higher resistance in the peripheral part as compared with the semiconductor current diffusion film located farther from the semiconductor active layer.

The semiconductor current diffusion layer can have a stacked structure of a plurality of semiconductor current diffusion films, and the semiconductor current diffusion film located nearer the semiconductor active layer can formed so as to have a greater thickness in a peripheral part located far from a center of a region surrounding the current confinement regions as compared with a central part located near the center of the region surrounding the current confinement regions.

A minimal radius r µm of a region surrounding the current confinement regions and a film thickness s µm of the semiconductor current diffusion layer can satisfy relations $$s < 5\sqrt{r}$$

and $$s > ((\sqrt{2}-1)/2) \times r.$$

The semiconductor current diffusion layer can be provided so as to be in contact with the current confinement region.

A third reflecting mirror layer having a third semiconductor multilayer film can be provided between the semiconductor current diffusion layer and the second reflecting mirror layer.

DETAILED DESCRIPTION OF THE INVENTION

Hereinafter, embodiments of the present invention will be described in detail with reference to the drawings. Further, the invention is not limited to embodiments hereinafter, and can be used by exercise various ingenuities.

First Embodiment

Figure 1:
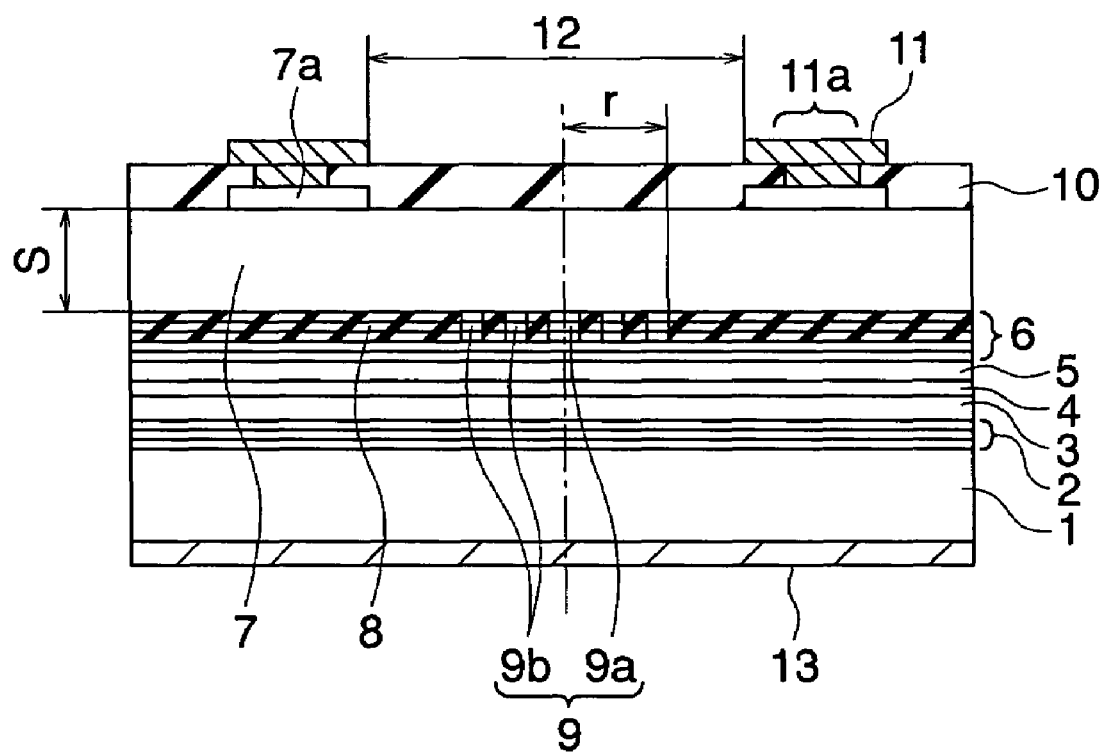
FIG. 1 is a sectional view showing a surface emitting type optical semiconductor device according to a first embodiment of the present invention.

A surface emitting type optical semiconductor device according to a first embodiment of the present invention is shown in FIG. 1. The surface emitting type optical semiconductor device is a surface emitting type laser. A semiconductor film reflecting mirror layer 2 is provided on a GaAs substrate 1. A clad layer 3 is provided on the semiconductor multilayer film reflecting mirror layer 2. An active layer 4 is provided on the clad layer 3. Furthermore, a clad layer 5 is provided on the active layer 4. A semiconductor multilayer filter reflecting mirror 6 is provided on the clad layer 5. In the semiconductor multilayer film reflecting mirror layer 6, an impurity region 8 is formed by injecting, for example, protons. A plurality of current confinement regions 9a and 9b for confining the current flow are formed in the semiconductor multilayer film reflecting mirror layer 6 by the impurity region 8. The impurity region 8 is higher in resistance than the current confinement regions 9a and 9b. In other words, a current confinement structure for confining the current is formed in the semiconductor multilayer film reflecting mirror layer 6 by the impurity region 8, and in addition the current confinement regions 9a and 9b for confining the current are formed. By the way, the depth of the impurity region 8, i.e., the depth of the proton injection is desired to be a depth that does not arrive at the active layer 4. Even if the proton injection arrives at the clad layer 5, it does not matter as long as the active layer 4 is not damaged. If the proton injection does not arrive at the clad layer 5, a structure that does not damage the active layer 4 can be formed certainly. By the way, the semiconductor multilayer film reflecting mirror layers 2 and 6 form a resonator in a direction perpendicular to the substrate 1.

A conductive semiconductor current diffusion layer 7 is provided on the semiconductor multi-layer film reflecting mirror layer 6. The thickness of the conductive current diffusion layer 7 is S micrometer. A contact layer 7a is provided on the surface of the semiconductor current diffusion layer 7 so as to surround a plurality of current confinement regions 9a and 9b. The minimal radius of the surrounding circle of the current confinement regions 9a and 9b is r micrometer. In a passivation film 10, an opening having a contact layer 7a exposed at its bottom is provided. A surface side electrode 11 formed of, for example, metal is provided so as to be embedded in the opening. As a result, the surface side electrode 11 and the contact layer 7a are electrically connected to each other via the contact layer 11a which is a portion of the surface side electrode 11 embedded in the opening. The contact layer 7a is formed of a semiconductor, and is formed so as to become low in resistance of contact with the metal electrode 11 by raising the impurity concentration. Furthermore, in the surface side electrode 11, an opening portion 12 is provided so as to correspond to a region including the current confinement regions 9a and 9b surrounded by the contact layer 7a. A substrate side electrode 13 is provided on the opposite side of the substrate 1 from the semiconductor multilayer film reflecting mirror layer 2.

If in the surface emitting type optical semiconductor device having such a configuration a current is let flow between the surface side electrode 11 and the substrate side electrode 13, a current is injected into the active layer 4 through the semiconductor current diffusion layer 7 and a plurality of current confinement regions 9a and 9b. Light emitted from the active layer 4 is resonated by an optical cavity including the reflecting mirror layers 2 and 6. Laser light is emitted from the opening portion 12 to the outside.

In the surface emitting type optical semiconductor device according to the present embodiment, the semiconductor current diffusion layer 7 and the current confinement regions 9a and 9b are provided. Therefore, a current from the surface side electrode 11 flows through the current confinement regions 9a and 9b substantially uniformly via the semiconductor current diffusion layer 7 and the current is injected into the active layer 4.

Even if in the present embodiment the total area of the light emitting region, i.e., a region of the active layer corresponding to the current confinement regions 9a and 9b is made large, it is not necessary to make the area of each light emitting region large and the injected current can easily spread within the individual current confinement region. In addition, in the present embodiment the uniformity of the current density injected between the current confinement regions 9a and 9b can be raised by providing the semiconductor current diffusion layer 7. As a whole, therefore, uniform current injection becomes possible. Even if the injection current density of the whole is raised and the optical output of the whole is increased, therefore, the distribution of the current injection density is hard to occur within each light emitting region, and uniform operation can be obtained. Furthermore, since the semiconductor current diffusion layer 7 is provided in the present embodiment, it is not necessary to provide individual electrodes in the current confinement regions 9a and 9b or provide an electrode in close vicinity to each current confinement region. As a result, it becomes possible to form the current confinement regions in vicinity to each other in the range of position precision of the ion implantation, and the current confinement regions can be formed at high density. Since the distance between the current confinement regions can be made to approach a wavelength order, it is also possible to cause light interference, and in some designs it is also possible to cause respective current confinement regions to operate as independent devices, or cause the current confinement regions to operate as a one body device. If current confinement regions are made to operate as independent devices, then portions that become high in current density injected into the light emitting region layer are formed so as to correspond to the current confinement regions, and distribution occurs in the light emitting intensity. Even if the regions having high light emitting intensity and corresponding to the current confinement regions operate as independent devices and there is no direct correlation between light beams of the regions having high light emitting intensity, light is propagated between the multilayer film reflecting mirror 2 and the multilayer film reflecting mirror 6 in a direction perpendicular to the multilayer film reflecting mirror 2 and the multilayer film reflecting mirror 6, and light spreads in a direction perpendicular to the propagation direction and light beams form the current confinement regions interfere with each other. Thus, the current confinement regions may conduct laser operation as a joint phenomenon.

Furthermore, in the present embodiment, the impurity region 8 is formed in the semiconductor multiplayer film reflecting mirror layer 6 by ion implantation and the current confinement regions 9a and 9b for confining the current are formed by the impurity region 8. The conductive semiconductor current diffusion layer 7 is formed on the semiconductor multilayer film reflecting mirror layer 6. The metal electrode 11 is provided on the semiconductor current diffusion layer 7. Unlike the case where the semiconductor diffusion layer 7 is not provided, therefore, it becomes possible to provide the metal electrode 11 on the surface of the semiconductor current diffusion layer 7 outside the region where light is emitted to the outside, i.e., outside the opening portion 12 and form an ohmic junction between the semiconductor current diffusion layer 7 and the metal electrode 11. Therefore, the forming position of the electrode 11 is not restricted to the portion corresponding to the current confinement regions 9a and 9b. Thus, it becomes possible to increase the area of the electrode 11 and the electrode resistance can be made small.

Furthermore, the contact layer 7a having a high impurity concentration and low resistance of contact with the metal is provided under the electrode 11 to lower the ohmic contact resistance. Since the contact layer is not present on the surface portion corresponding to the current confinement region, however, it is possible to prevent optical absorption loss from occurring.

Furthermore, the contact layer and metal are provided outside the opening portion 12. Unlike the conventional device, the contact layer and metal do not play a role of determining the optical opening diameter on the surface of the current confinement regions. Therefore, the current confining path positions according to the ion implantation, the inside diameter of the contact layer, and the working precision of the inside diameter of the electrode do not exert influence upon the device characteristics so remarkably as the conventional device.

Especially, if the resistance of the conductive semiconductor current diffusion layer is made small, it is also possible to keep the position of the electrode apart from the positions of the current confinement regions. The degree of freedom in the design concerning the electrode forming position can be thus increased. If the conductive semiconductor current diffusion layer 7 is made lower in resistivity that the current confinement regions to reduce the value of (resistance of the current path between the electrode portion and the current confinement regions)/(resistance in the current confinement regions), then the proportion of resistance occupied by the current confinement regions can be made high and uniform current injection becomes possible.

Second Embodiment

Figure 2:
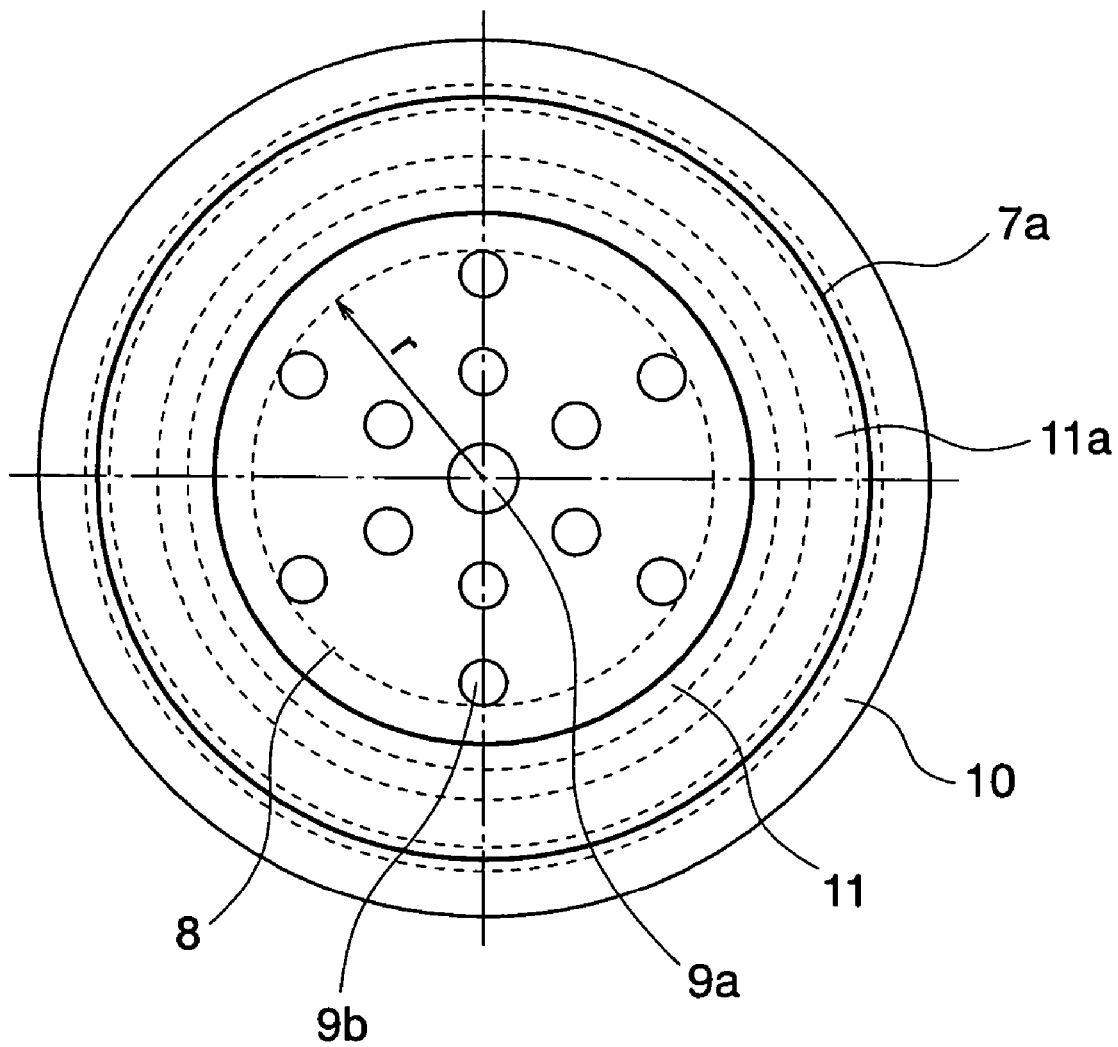
FIG. 2 is a top view showing a surface emitting type optical semiconductor device according to a second embodiment of the present invention.

A surface emitting type optical semiconductor device according to a second embodiment of the present invention will now be described with reference to FIG. 2. The surface emitting type optical semiconductor device according to the present embodiment has a configuration obtained by arranging a plurality of current confinement regions 9a and 9b in the surface emitting type optical semiconductor device according to the first embodiment shown in FIG. 1 so as to increase the device resistance for injecting the current as the position moves from the center of the region including the current confinement regions 9a and 9b surrounded by the contact layer 7a toward the contact layer 7a. Such a configuration can be implemented by, for example, providing a current confinement region 9a having a comparatively wide area at the center of the region including the current confinement regions 9a and 9b surrounded by the contact layer 7a as shown in FIG. 2 and providing a plurality of (in FIG. 2, twelve) current confinement regions 9b that are narrower in area than the current confinement region 9a concentrically around the current confinement region 9a. The number of current confinement regions 9b provided along the same concentric circle is six, and current confinement regions provided on different concentric circles are arranged radially. The minimal radius of the surrounding circle of the current confinement regions 9a and 9b is r micrometer. By the way, FIG. 2 is a top view of the surface emitting type optical semiconductor device according to the present embodiment with the semiconductor current diffusion layer 7 and the passivation film 10 in the opening portion 12 being omitted.

In this way, the surface emitting type optical semiconductor device according to the present embodiment has a configuration in which the device resistance for injecting the current is increased as the position moves from the center of the region including the current confinement regions 9a and 9b surrounded by the contact layer 7a toward the contact layer 7a. Therefore, it becomes possible for a current to flow to the current confinement region 9a located far from the contact layer 7a easier than to the current confinement region 9b located near the contact layer 7a. Thus it becomes possible to prevent the injection current quantity from falling as the distance from the contact layer 7a increases. As a result, the current flows through the current confinement regions 9a and 9b substantially uniformly.

The area of the current confinement region 9a located far from the contact layer 7a is made considerably larger than the area of each of the current confinement regions 9b located near the contact layer 7a. Thus, a greater current is let flow through the current confinement region 9a to increase the density of the current flowing through the current confinement region 9a. As a result, it becomes possible to raise the optical density in portions of the active layer 4 corresponding to the current confinement region 9a, and stable light emission in the lateral mode is obtained.

The minimal radius of the surrounding circle of the current confinement regions 9a and 9b is r micrometer.

It is a matter of course that the second embodiment also brings about effects similar to those of the first embodiment.

Third Embodiment

Figure 3:
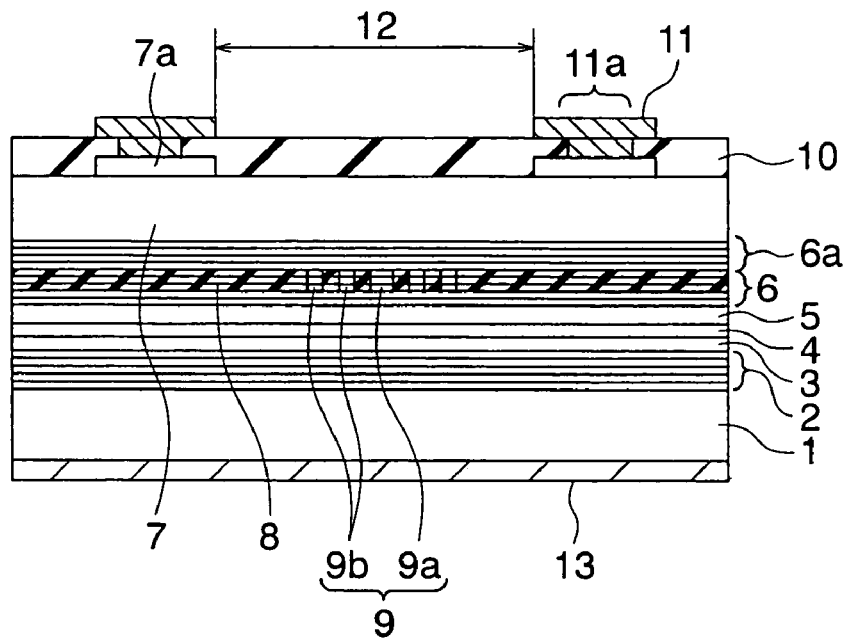
FIG. 3 is a sectional view showing a surface emitting type optical semiconductor device according to a third embodiment of the present invention.

A surface emitting type optical semiconductor device according to a third embodiment of the present invention is shown in FIG. 3. The surface emitting type optical semiconductor device according to the present embodiment has a configuration obtained by providing a semiconductor multilayer film reflecting mirror layer 6a formed by vapor growth or adhesion between the semiconductor multilayer film reflecting mirror layer 6 and the semiconductor current diffusion layer 7 in the surface emitting type optical semiconductor device according to the first or second embodiment. The semiconductor multilayer film reflecting mirror layer 6a is formed by vapor-phase growth or adhesion, and the semiconductor multilayer film reflecting mirror layer 6a does not have a region in which protons are injected.

The surface emitting type optical semiconductor device according to the present embodiment is effective when the total film thickness of the semiconductor multilayer film reflecting mirror layer 6 and 6a provided on the active layer 4 is thick as in the 1.3 μm band laser or 1.5 μm band laser used for optical communication and the ion implantation region 8 is formed near the active layer 4 as far as possible to make the total area of the current confinement regions 9a and 9b substantially equal to the current injection area in the active layer 4.

In the present embodiment, the total area of the current confinement regions 9a and 9b can be made substantially equal to the current injection area in the active layer 4. As a result, low threshold operation becomes possible, and surface emitting type laser having high mode stability can be obtained.

It is a matter of course that the second embodiment also brings about effects similar to those of the first embodiment.

Fourth Embodiment

Figure 4A:
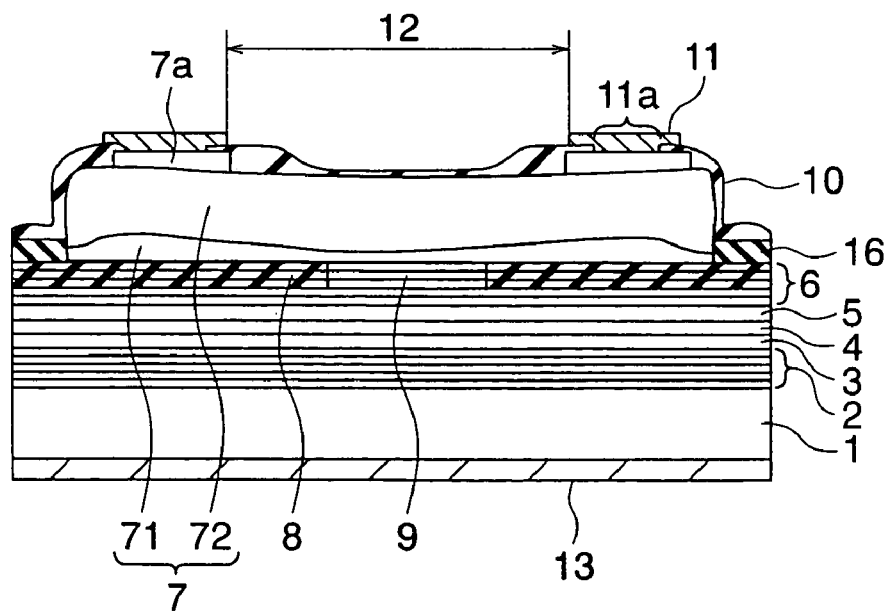
FIG. 4A is a sectional view showing a surface emitting type optical semiconductor device according to a fourth embodiment of the present invention.

A surface-emitting type optical semiconductor device according to a fourth embodiment of the present invention is shown in FIG. 4A. The surface emitting type optical semiconductor device according to the present embodiment has a configuration obtained by reducing a plurality of current confinement regions 9a and 9b to a single current confinement region in the surface emitting type optical semiconductor device according to the first embodiment shown in FIG. 1 and forming the semiconductor current diffusion layer 7 by laminating a plurality of (in FIG. 4A, two) layers, i.e., current diffusion films 71 and 72. The current diffusion film 71 located nearer the active layer 4 is formed so as to have higher resistance in a peripheral part located far from the center of the current confinement region 9 as compared with a central part located near the center of the current confinement region 9. The current diffusion film 72 located farther from the active layer 4 is formed so as to be substantially definite in carrier concentration and film thickness. The current diffusion film 71 may have a configuration in which the carrier concentration is made lower to increase the resistance in the peripheral part located far from the center of the current confinement region 9 as compared with the central part located near the center of the current confinement region 9. Or the current diffusion film 71 may have a configuration in which the mobility is made lower to increase the resistance in the peripheral part located far from the center of the current confinement region 9 as compared with the central part located near the center of the current confinement region 9. Or the current diffusion film 71 may have a configuration in which the thickness is made greater to increase the resistance in the vertical direction in the peripheral part located far from the center of the current confinement region 9 as compared with the central part located near the center of the current confinement region 9. Especially, if the thickness is made greater, the resistance in a direction perpendicular to the active layer 4 of the device becomes high and the resistance in a direction parallel to the active layer 4 becomes lower and consequently it is effective in injecting the current into the current confined region 9 uniformly. In the current diffusion film 72, the carrier concentration is higher and the resistance is lower than the peripheral part of the current diffusion film 71 located far from the center of the current confinement region 9. In FIG. 4A, reference numeral 16 denotes a selective growth mask described in an example described later.

Owing to such a configuration, the current easily flows through the central part of the current confinement region 9 as compared with the case where the current diffusion layer 7 has a uniform configuration. Thus, it becomes possible to make the current density in the central part of the current confinement region relatively high and the current can be injected uniformly.

In the present embodiment, the semiconductor current diffusion layer 7 is formed by laminating a plurality of current diffusion films. Alternatively, the semiconductor current diffusion layer 7 may be a single layer. If in this case the semiconductor current diffusion layer 7 is formed to have high resistance on the active layer 4 side and low resistance on the contact layer 7a side in the peripheral part located far from the center of the current confinement region 9 and have low resistance in the central part located near the center of the current confinement region 9, similar effects can be brought about. It can be effectively regarded as lamination of a plurality of current diffusion films.

Fifth Embodiment

Figure 4B:
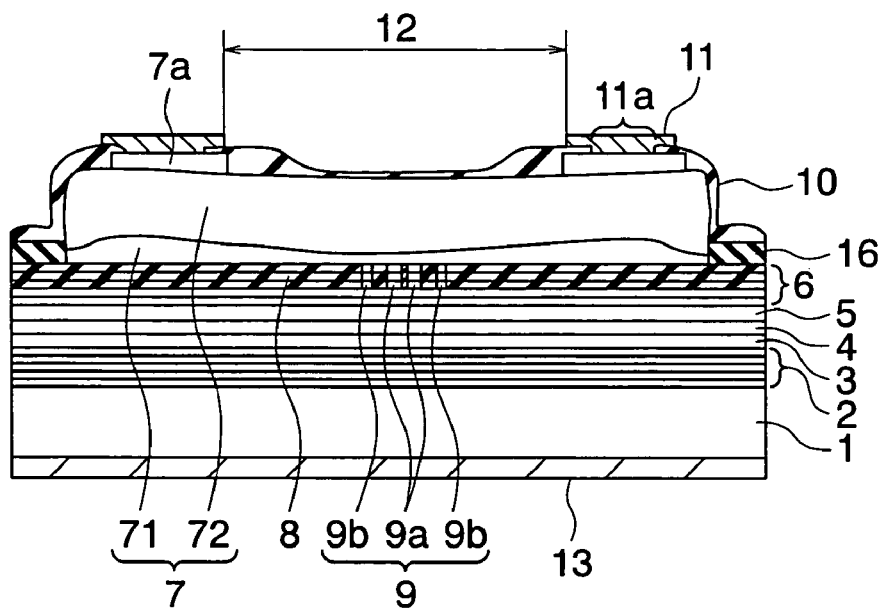
FIG. 4B is a sectional view showing a surface emitting type optical semiconductor device according to a fifth embodiment of the present invention.

A surface emitting type optical semiconductor device according to a fifth embodiment of the present invention is shown in FIG. 4B. The surface emitting type optical semiconductor device according to the present embodiment has a configuration obtained by providing a plurality of current confinement regions 9a and 9b in the surface emitting type optical semiconductor device according to the fourth embodiment shown in FIG. 4A. In the present embodiment, the semiconductor current diffusion layer 7 has a configuration obtained by laminating a plurality of (in FIG. 4B, two) current diffusion films 71 and 72. The current diffusion film 71 located nearer the active layer 4 is formed so as to be lower in carrier concentration, greater in thickness, and higher in resistance in a peripheral part located far from the center of the current confinement region 9 as compared with a central part located near the center of the current confinement region 9. The current diffusion film 72 located farther from the active layer 4 is formed so as to be substantially definite in carrier concentration and film thickness. In the current diffusion film 72, the carrier concentration is higher and the resistance is lower than the peripheral part of the current diffusion film 71 located far from the center of the current confinement region 9. In FIG. 4B, reference numeral 16 denotes a selective growth mask described in an example described later.

Owing to such a configuration, it becomes easy for the current to flow to the current confinement region 9a located in the central part as compared with the first to third embodiments. It becomes possible to inject the current to the current confinement regions more uniformly.

In the present embodiment, the semiconductor current diffusion layer 7 is formed by laminating a plurality of current diffusion films. Alternatively, the semiconductor current diffusion layer 7 may be a single layer. If in this case the semiconductor current diffusion layer 7 is formed to have high resistance on the active layer 4 side and low resistance on the contact layer 7a side in the peripheral part located far from the center of the current confinement region 9 and have low resistance in the central part located near the center of the current confinement region 9, similar effects can be brought about. It can be effectively regarded as lamination of a plurality of current diffusion films.

Sixth Embodiment

Figure 5:
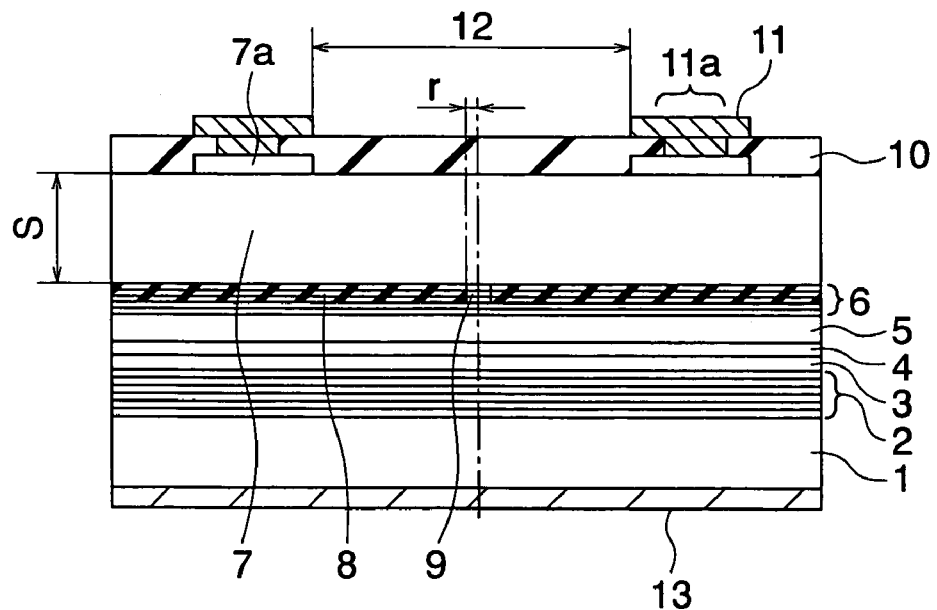
FIG. 5 is a sectional view showing a surface emitting type optical semiconductor device according to a sixth embodiment of the present invention.

A surface emitting type optical semiconductor device according to a sixth embodiment of the present invention is shown in FIG. 5. The surface emitting type optical semiconductor device according to the present embodiment has a configuration obtained by reducing a plurality of current confinement regions 9a and 9b to a single current confinement region 9, (a) making the contact resistance between the semiconductor current diffusion layer 7 and the electrode 11 higher than the resistance of the semiconductor current diffusion layer in a longitudinal direction (film thickness direction), and (b) making the resistance of the semiconductor current diffusion layer 7 between the current confinement region 9 and the electrode 11 in the lateral direction (film surface direction) lower than the resistance in the longitudinal direction.

A conductive semiconductor layer having a carrier concentration of approximately $1 \times 10^{18}$ cm$^{-3}$ which can be applied to the laser has contact resistance of the order of approximately 160/(contact area) $\Omega/\mu m^2$. Letting the electrode 11 be L μm in radius, the semiconductor current diffusion layer 7 be s μm in thickness, a shortest distance between the center of the current confinement region 9 and its end part at a junction plane between the current confinement region 9 and the conductive semiconductor current diffusion layer 7 be r μm, and the semiconductor current diffusion layer 7 be ρΩ·cm in resistivity, the contact resistance is represented as $160/(s \times L)$ Ω whereas the resistance of the semiconductor current diffusion layer 7 in the longitudinal direction is represented as $s \div (\pi \times r \times r) \times \rho \Omega$. The condition:

contact resistance>resistance of semiconductor current diffusion layer in longitudinal direction becomes as follows.

$$160/(s \times L)\Omega > s \div (\pi \times r \times r) \times \rho \Omega \quad (1)$$

It is desirable that the opening portion 12 of the electrode 11 is larger in diameter than the current confinement region 9. At the same time, it is desirable that the diameter of the opening portion 12 is not too large. Therefore, the radius L of the electrode 11 becomes nearly equal to the shortest distance r between the center of the current confinement region 9 and its end part. When the carrier concentration is $1 \times 10^{18}$ cm$^{-3}$, ρ is approximately $2.5 \times 10^{-3}$ Ω·cm. On the basis of the inequality (1), therefore, it is desirable to satisfy the following relation.

$$s < 5\sqrt{r} \quad (2)$$

In the range represented by the expression (2), the relation (a) represented as contact resistance>resistance of semiconductor current diffusion layer in longitudinal direction is satisfied, and the effect of widening the effective area of the ohmic electrode and reducing the device resistance can be obtained.

Furthermore, in the present embodiment, the relation (b) yields the following relation.

$$s > ((\sqrt{2}-1)/2) \times r \quad (3)$$

If the condition of the expression (3) is satisfied, the resistance of the semiconductor current diffusion layer 7 between the current confinement region 9 and the electrode 11 in the lateral direction can be made lower than the resistance in the longitudinal direction. The reason will now be described. If the upper part of the current confinement region 9 has a circular section and approximation is conducted, then the resistance of the semiconductor current diffusion layer 7 in the longitudinal direction can be approximated as follows.

$$\text{resistivity} \times s/(\pi \times r \times r) \quad (4)$$

On the other hand, if the current is confined, the current spreads at an angle of approximately 45 degrees outside the current confinement region. Therefore, the resistance of the semiconductor current diffusion region 7 in the lateral direction can be approximated as follows.

$$\text{resistivity} \times (s/2)/(2 \times \pi \times (r+s) \times s) \quad (5)$$

On the basis of the expressions (4) and (5), the relation (3) is obtained.

If such a relation is satisfied, the resistance of current diffusion in the lateral direction can be made lower in the current diffusion region 9 than the resistance in the longitudinal direction. If the size of the current confinement region 9 and the thickness of the semiconductor current diffusion layer 7 are kept in a range satisfying this condition, then the resistance for the current to spread from the current confined region 9 to the electrode 11 becomes sufficiently low. Thus the effect of device resistance reduction owing to the widened electrode area can be obtained by spreading the current in the semiconductor current diffusion layer 7.

Furthermore, in the present embodiment, the impurity concentration of the semiconductor current diffusion region 7 must $2 \times 10^{18}$ cm$^{-3}$ or less. The reason will now be described. If the impurity concentration of the semiconductor current diffusion region 7 rises to a concentration exceeding $1 \times 10^{19}$ cm$^{-3}$, then the Wannier exciton radius of impurities and the distance between impurity atoms approximately coincides with each other, and a change abruptly occurs in physical properties. As a result, the optical absorption coefficient of energy smaller than the band end becomes large. If a device structure in which light passes through a layer that exceeds $1 \times 10^{19}$ cm$^{-3}$ in impurity concentration is selected, the optical loss is large and it becomes difficult to raise the optical output and the threshold of the laser also becomes high.

Therefore, it is necessary to make the impurity concentration $1 \times 10^{19}$ cm$^{-3}$ or less. Furthermore, it is desirable to make the distance between impurity atoms twice the Wannier exciton radius or more. This condition corresponds to the carrier concentration of $2 \times 10^{18}$ cm$^{-3}$ or less. If such a condition is satisfied, then the optical absorption coefficient at the band end or less is considerably small, and it becomes possible to use the semiconductor current diffusion layer 7 as a semiconductor current diffusion layer which transmits output light. What is to be regarded will now be described. As described above, the present embodiment aims at reducing the resistance in the lateral direction as compared with the longitudinal direction and controlling the current of the surface emitting type laser (hereafter referred to also as VCSEL (Vertical Cavity Surface Emitted Laser diode)). Unlike the conventional technique, the geometrical structure, i.e., the thickness and spread in the lateral direction of the semiconductor current diffusion layer is controlled. As a result, the efficiency of injection of carriers into the center of the device is raised without providing a region having an excessively high carrier concentration. Accordingly, the device characteristics of the VCSEL having stable modes can be improved.

If the sectional shape of the current confinement region 9 is nearly circular and the shortest distance r between the center and the end portion of the current confinement region 9 is definite, then the precision of approximation described above becomes high and it becomes possible to obtain the effect of the semiconductor current diffusion layer more certainly.

If the current confinement region is made of plural sections, the shortest distance between the center and the end portion of the current confinement region corresponds to the radius of the minimal circle which includes the all current confinement regions. One of the examples is embodied in embodiment 1 and 2.

If the thickness of the semiconductor current diffusion layer 7 is made larger than the inside diameter of the electrode 11, then the resistance of the semiconductor current diffusion layer 7 in the lateral direction becomes lower than the resistance in the longitudinal direction, the current is injected into the current confinement regions 9 uniformly, and a uniform optical output can be obtained. It is more desirable.

Furthermore, in the present embodiment, the contact layer 7a is provided outside the current when seen from the output light side of the device. If the carrier concentration of the contact layer 7a is made $1 \times 10^{19}$ cm$^{-3}$ or more, the carrier concentration of the semiconductor can be set to a concentration at which the resistance to the metal electrode 11 abruptly falls, without increasing the optical loss. As a result, a device that is excellent in optical output and temperature characteristics can be implemented.

By the way, the conditions of the expressions (2) and (3) described in the present embodiment may be applied to the surface emitting type optical semiconductor devices according to the first to third embodiments and surface emitting type optical semiconductor devices according to seventh to eighth embodiments described later.

Seventh Embodiment

Figure 6:
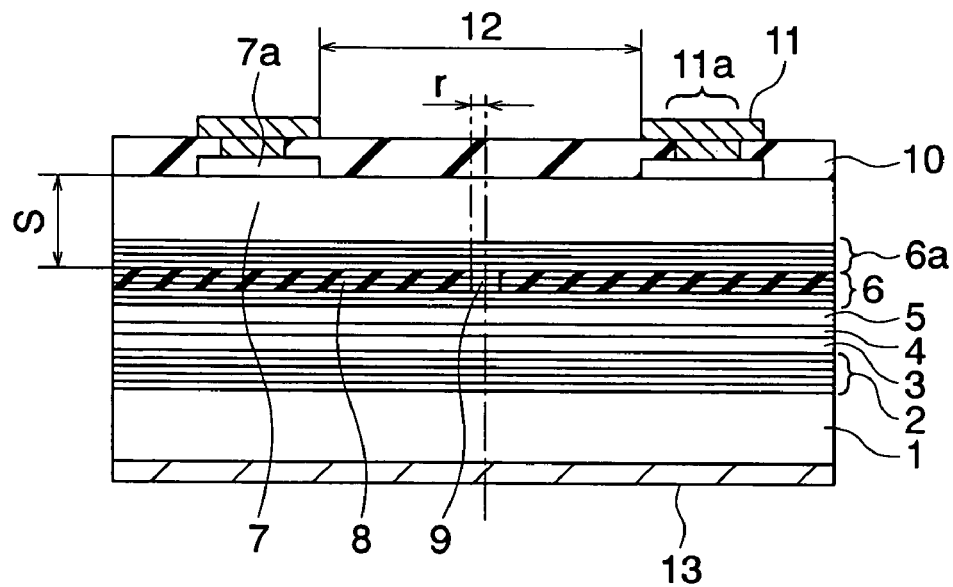
FIG. 6 is a sectional view showing a surface emitting type optical semiconductor device according to a seventh embodiment of the present invention.

A surface emitting type optical semiconductor device according to a seventh embodiment of the present invention is shown in FIG. 6. The surface emitting type optical semiconductor device according to the present embodiment has a configuration obtained by providing a semiconductor multilayer film reflecting mirror layer 6a formed by vapor growth or adhesion between the semiconductor multilayer film reflecting mirror layer 6 and the semiconductor current diffusion layer 7 in the surface emitting type optical semiconductor device according to the sixth embodiment. The semiconductor multilayer film reflecting mirror layer 6a is formed by vapor growth or adhesion, and the semiconductor multilayer film reflecting mirror layer 6a does not have a region in which protons are injected.

The surface emitting type optical semiconductor device according to the present embodiment is effective when the total film thickness of the semiconductor multilayer film reflecting mirror layer 6 and 6a provided on the active layer 4 is thick as in the 1.3 µm band laser or 1.5 µm band laser used for optical communication and the ion implantation region 8 is formed near the active layer 4 as far as possible to make the section area of the current confinement region 9 substantially equal to the current injection area in the active layer 4.

In the present embodiment, the section area of the current confinement region 9 can be made substantially equal to the current injection area in the active layer 4. As a result, low threshold operation becomes possible, and surface emitting type laser having high mode stability can be obtained.

It is a matter of course that the present embodiment also brings about effects similar to those of the sixth embodiment.

Eighth Embodiment

A surface emitting type optical semiconductor device according to an eighth embodiment of the present invention will now be described with reference to FIG. 5. The surface emitting type optical semiconductor device according to the present embodiment has a configuration obtained by reducing a plurality of current confinement regions 9a and 9b to a single current confinement region and the depth of the current confinement region 9 is made larger than the radius of the section of the current confinement region 9 in the surface emitting type optical semiconductor device according to the first embodiment shown in FIG. 1. Here, the radius of the current confinement region is a long side of a principal part of the section of the current confinement region. For example, if the section is a circle, the long side is its radius. If the section is an ellipse, the long side is its major axis. If the section is a rectangle, the long side is a half of length of its diagonal.

In the present embodiment having such a configuration, the depth of the current confinement region 9 is larger than the radius of the current confinement region 9. Within the current confinement region 9, therefore, the current injected in the active layer 4 spreads nearly uniformly. As a result, it is possible to obtain a surface emitting type optical semiconductor device having low resistance, high optical output and high mode stability.

By the way, the configuration in which the depth of the current confinement region is made larger than the radius of the section of the current confinement region can be applied to the surface emitting type optical semiconductor devices according to the fourth, sixth and seventh embodiments. In addition, the configuration can also be applied to the surface emitting type optical semiconductor devices according to the first to third and fifth embodiments having a plurality of current confinement regions. If the present embodiment is used, it is possible to increase the total area of the light emitting region by the number of the current confinement regions while maintaining the current uniformity among individual current confinement regions. Therefore, the present embodiment becomes advantageous especially in high output light emitting devices.

The embodiments of the present invention will be described in more detail with reference to examples.

FIRST EXAMPLE

A surface emitting type optical semiconductor device according to a first example of the present invention will now be described with reference to FIG. 5. The surface emitting type optical semiconductor device in this example is a 650 nm band red AlGaInP surface emitting type laser in which clad layers 3 and 5 formed of an InGaAlP material and semiconductor multilayer film reflecting mirror layers 2 and 6 formed of an AlGaAs material are disposed on both sides of the semiconductor active layer 4.

This surface emitting type laser includes a substrate side semiconductor multilayer film reflecting mirror layer 2 obtained by laminating sixty $Al_qGa_{1-q}As$ (q=0.95) layers and sixty $Al_sGa_{1-s}As$ (s=0.5) layers alternately on an n-type GaAs substrate 1, an n-conductivity type substrate side clad layer 3 formed of $In_{0.5}(Ga_{0.3}Al_{0.7})_{0.5}P$, an active layer 4 having a light emitting wavelength of 650 nm and a quadruple quantum well, which includes InGaP quantum wells and $In_{0.5}(Ga_{0.5}Al_{0.7})_{0.5}P$ quantum well barriers, a p-conductivity type surface side clad layer 5 formed of $In_{0.5}(Ga_{0.3}Al_{0.7})_{0.5}P$, and a surface side semiconductor multilayer film reflecting mirror layer 6 having a total thickness of 2.5 μm obtained by laminating fifty $Al_sGa_{1-s}As$ (s=0.5) layers and fifty $Al_qGa_{1-q}As$ (q=0.95) layers alternately.

In addition, a semiconductor current diffusion layer 7 having a thickness of 1.5 μm formed of $Al_aGa_{1-a}As$ (a=0.6) is formed on the surface side semiconductor multilayer film reflecting mirror 6. A contact layer 7a formed of GaAs is formed on a part of the top of the semiconductor current diffusion layer 7. Here, the semiconductor current diffusion layer 7 has a carrier concentration of $1\times10^{18}$ cm$^{-3}$, and the contact layer 7a has a carrier concentration of $2\times10^{19}$ cm$^{-3}$. A high resistance region (or insulation region) 8 using proton injection is formed in the surface side semiconductor multilayer film reflecting mirror layer 6. A current confinement region 9 having a diameter of 4 μm is formed inside the high resistance region 8. The proton injection is conducted under the condition that the concentration reaches its peak at 2 μm. Under such a condition, the thickness of the impurity region 8 using the proton injection becomes larger than the radius of the current confinement region 9. Therefore, this corresponds to the sixth embodiment, and uniform current injection into the current confinement region becomes possible. Furthermore, the thickness (s) of the semiconductor current diffusion layer 7 and the diameter (r) of the current confinement region satisfy the sixth embodiment, and uniform current injection to the current confinement region becomes possible.

A $SiO_2$ passivation film 10 is formed on a part of the surface of the contact layer 7a and the surface of the semiconductor current diffusion layer 7 except the contact layer 7a. In addition, a surface side electrode 11 formed of Ti/Pt/Au is formed so as to come in contact with the contact layer 7a in a contact region 11a. The contact region 11a has a width of 10 μm. A current injected from the surface side electrode 11 is confined in path by the current confinement region 9 via the contact layer 7a and the semiconductor current diffusion layer 7, and injected into the active layer 4. An opening portion 12 including a part corresponding to the current confinement region 9 is provided in the surface side electrode 11. Laser light is taken out from a part of the opening portion 12 corresponding to the current confinement region 9. A substrate side electrode 13 formed of AuGaNi/Au is formed on the back of the substrate 1. Carriers supplied from the substrate side electrode 13 are injected into the active layer 4 via the substrate side semiconductor multilayer film reflecting mirror 2.

In such a surface emitting type laser in the present example, the semiconductor current diffusion layer 7 is provided. Therefore, the contact region 11a can be formed on the outer peripheral side than the current confinement region 9. Even if the current confinement region is made narrow, it is not necessary to impose restrictions on the area of the contact region 11a. Furthermore, the contact layer 7a can be formed in a region having a small optical density located outside the current confinement region 9. Even if the impurity concentration of the contact layer 7a is raised, therefore, the influence of absorption of output light can be reduced remarkably. For these two reasons, it becomes possible to reduce the contact resistance of the surface side electrode 11 remarkably.

In addition, the current confinement region 9 can be made small as compared with smaller one of the opening portion 12 of the surface side electrode 11 and the region located inside the contact layer 7a where the contact layer 7a is not formed. Therefore, the current can be concentrated into a region narrower than these regions, and the operation current can be made small independently of the lateral mode control of light. In addition, since the current density in a central part of the light emitting region can be made high, the mode stability can be attained.

In the present example, the passivation film 10 is provided inside the contact region 11a as well. Since light is taken out from the surface in the surface emitting type laser, the characteristics are remarkably affected by the surface state of the opening portion 12. Therefore, it is desirable to form the passivation film in the light taking out portion.

On the other hand, in the conventional surface emitting type laser of ion implantation type, the electrode contact is formed in a portion corresponding to the current confinement region. When forming the passivation film, therefore, it is necessary to form the passivation film inside the portion corresponding to the current confinement region. In this case, since the end of the passivation film overlaps a portion having a high optical density, light is scattered and the optical output and mode control are hampered.

On the other hand, in the present example, the contact region 11a is formed outside the current confinement region 9. As to a portion of the passivation film located inside the contact region 11a as well, its end can be formed in a portion having a low optical density located outside the current confined region. Thus, the influence of the problem that the end of the passivation film scatters the output light can be reduced remarkably. As a result, it becomes possible to obtain a surface light emitting laser having a high optical output, high mode stability and high reliability.

SECOND EXAMPLE

A surface emitting type optical semiconductor device according to a second example of the present invention will now be described with reference to FIG. 5. The present example has a configuration obtained by setting the outside diameter of the current confinement region 9 equal to 4 μm in the configuration of the first example.

In the present example, a surface emitting type semiconductor multilayer film reflecting mirror layer 6 obtained by laminating fifty $Al_sGa_{1-s}As$ (s=0.5) layers and fifty $Al_qGa_{1-q}As$ (q=0.95) layers alternately is formed. If the emitted light wavelength is 0.65 μm, the multilayer film reflecting mirror layer 6 has a thickness of 2.5 μm as a whole. If 2 μm or more of the multilayer film reflecting mirror layer 6 is provided with high resistance by ion implantation, its depth becomes greater than the radius 2 μm of the current confinement region 9. Ion implantation of protons is conducted so as to set the peak depth equal to 2 μm. If the semiconductor current diffusion layer 7 has a carrier concentration of $1\times10^{18}$ $cm^{-3}$ and the current confinement region 9 has a carrier concentration of $1\times10^{18}$ $cm^{-3}$, the current spreads into the current confinement region 9 from an end of the current confinement region 9 at an angle of nearly 45 degrees. On the active layer 4 side, therefore, the current spreads into the whole of the current confinement region 9 and uniform current injection becomes possible.

In the conventional technique, an ohmic electrode is formed on the surface of the surface side semiconductor multilayer film reflecting mirror layer corresponding to the current confinement region. If the surface of the surface side semiconductor multilayer film reflecting mirror layer is formed of $Al_{0.5}Ga_{0.5}As$ having a carrier concentration of $1\times10^{18}$ $cm^{-3}$ and the outside diameter and inside diameter of the contact region are respectively 4 μm and 3 μm, then the contact resistivity is on the order of $1\times10^{-5}$ $\Omega\cdot cm^2$. Therefore, the contact resistance exceeds 160 Ω.

On the other hand, in the present example, an $Al_{0.6}Ga_{0.4}As$ semiconductor current diffusion layer 7 having a carrier concentration of $1\times10^{18}$ $cm^{-3}$ and a thickness of 1.5 μm is provided, and a GaAs contact layer 7a having a carrier concentration of $2\times10^{19}$ $cm^{-3}$ is provided outside the current confinement region 9. A contact region 11a having an outside diameter of 10 μm and an inside diameter of 5 μm is formed on the contact layer 7a. The contact resistance can be lowered to 10Ω or less owing to the effect that the contact resistivity can be reduced to the order of $1\times10^{-6}$ $\Omega\cdot cm$ or less and the effect that the area of the contact region 11a can be widened. In this case, the current confinement region 9 has an outside diameter r of 2.5 μm and the semiconductor current diffusion layer 7 has a thickness s of 1.5 μm. Therefore, this example corresponds to the sixth embodiment, and the device resistance can be reduced. This point will now be described using actual numerical values. Resistance for letting flow a current from the contact region 11a to the current confinement region 9 via the semiconductor current diffusion layer 7 can be approximated by the following relation.

Resistivity of semiconductor current diffusion layer×
(shape factor in longitudinal direction (thickness
of semiconductor current diffusion layer/area of
current confinement region)+shape factor in lateral direction (current spread distance in lateral
direction in semiconductor current diffusion
layer/maximum value of cross section area
through which current flows in current diffusion
layer)

The $Al_{0.6}Ga_{0.4}As$ semiconductor current diffusion layer 7 having a carrier concentration of $1\times10^{18}$ $cm^{-3}$ has a resistivity of approximately 0.06 Ω·cm. Therefore, the resistance becomes as follows.

0.06 Ω·cm×(1.5 μm/(π×3.5 μm×2 μm)+1.5 μm/2/(2× π×3.5 μm×1.5 μm))≈68 Ω

As a result, the total resistance becomes 80Ω or less by adding the contact resistance and the resistance of the semiconductor current diffusion layer 7. As compared with the conventional case, the total resistance can be decreased to 50% or less.

In addition, since the contact region 11a which generates much heat can be spread outside the current confinement region 9, it is also possible to prevent the device temperature from rising. By the way, increasing the carrier concentration of the contact layer 7a is important in reducing the contact resistance. If the carrier concentration is raised, however, the absorption coefficient for laser light also becomes greater. In the present example, the contact layer 7a is provided outside the current confinement region 9 and kept apart from the portion having a high optical density, and consequently the carrier concentration can be raised.

Furthermore, in the present example, the laser light has a wavelength of 650 nm, and its energy is greater than the band gap of GaAs in which it is easy to make crystal having a high carrier concentration grow. In the present example, the contact layer 7a of GaAs is provided in a low optical density portion located outside the current confinement region 9. As a result, a laser that is hardly affected by the output loss and that is high in output can be obtained.

In connection with the present example, an upper limit of the thickness of the semiconductor current diffusion layer 7 will now be described. If the semiconductor current diffusion layer 7 is provided as described above, then the degree of freedom in forming the contact layer 7a increases and the contact resistance can be decreased. If the semiconductor current diffusion layer 7 is too thick, however, the resistance against passing through this layer becomes large. Therefore, there is a proper value in the upper limit of the thickness. For decreasing the resistance of the whole device, it is necessary to suppress the resistance increase caused by addition of the resistance of the semiconductor current diffusion layer 7 in the longitudinal direction to a value smaller than the decrease in contact resistance.

Therefore, it is necessary to satisfy the following relation:

contact resistance>resistance of semiconductor current diffusion layer in longitudinal direction To satisfy this relation, it becomes necessary to satisfy the condition $$s<5\sqrt{r}$$

where s is the thickness of the semiconductor current diffusion layer 7, and r is the shortest distance between the center of the current confinement region 9 and its end part at the junction plane between the current confinement region 9 and the conductive semiconductor current diffusion layer 7, as described with reference to the sixth embodiment.

In addition, for causing the surface emitting type laser of ion implantation type to conduct the single mode operation in the lateral direction, it is desirable to satisfy the relation r<≈6 μm. Therefore, it is desirable to set the thickness s of the semiconductor current diffusion layer 7 to 12 μm or less.

On the other hand, considering the longitudinal-lateral resistance ratio in the semiconductor current diffusion layer 7, it is desirable to satisfy the relation $$s>(\sqrt{2}-1)/2)\times r$$

as described with reference to the sixth embodiment. Therefore, it follows that s>1.2 μm.

The surface emitting type laser described above and shown in FIG. 5 can be formed using a method described below.

First, the substrate side semiconductor multilayer film reflecting mirror layer 2, the substrate clad layer 3 of n-conductivity type, the semiconductor active layer 4, the surface side clad layer 5 of p-conductivity type, and the surface side semiconductor multilayer film reflecting mirror layer 6 are formed successively over the GaAs substrate 1 by using, for example, the metal organic chemical vapor deposition (MOCVD) method. The MOCVD growth is conducted by using indium trimethyl as a raw material for In, gallium trimethyl or gallium triethyl as a raw material for Ga, arsine or tertiary butyl arsine as a raw material for arsenic, and phosphine or tertiary butyl phosphine as a raw material for phosphorus. It is possible to use silane as a raw material for n-type dopants, and dimethyl zinc or carbon tetrabromide as a raw material for p-type dopants. As regards the surface side semiconductor multilayer film reflecting mirror layer 6 obtained by laminating fifty $Al_xGa_{1-x}As$ (x=0.5) layers and fifty $Al_yGa_{1-y}As$ (y=0.95) layers alternately, and the semiconductor current diffusion layer 7 formed of $Al_aGa_{1-a}As$ (a=0.6) described later, it is desirable to use carbon as the dopant. If carbon is used as p-type impurities, then doping can be conducted to a high concentration and diffusion of p-type impurities to the active layer 4 hardly occurs. As for the thickness of the semiconductor multilayer film reflecting mirror layers 2 and 6, the AlGaAs (Al composition 0.5) layer and the AlGaAs (Al composition 0.95) layer are set in thickness respectively to 47 nm and 52 nm so as to cause the optical distance for light having a wavelength of 650 nm generated by laser oscillation to become equal to a quarter of wavelength.

The total optical distance of the n-conductivity type substrate side clad layer 3, the semiconductor active layer 4, and the p-conductivity type surface side clad layer 5 is set so as to become equal to m/4×wavelength (where m is an odd number) for the laser oscillation wavelength.

Figure 7:
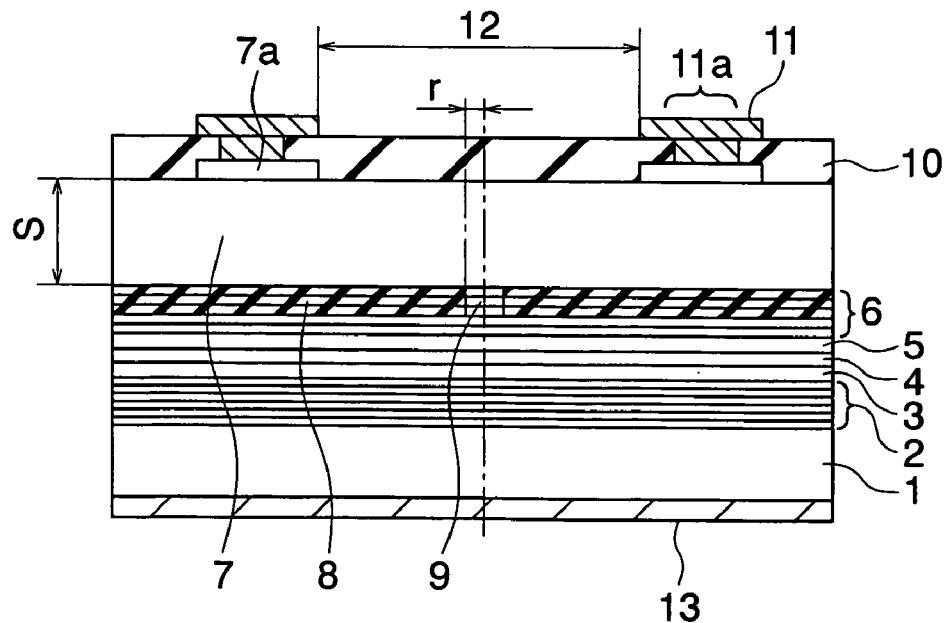
FIG. 7 is a sectional view showing a surface emitting type optical semiconductor device according to an modification of a second example of the present invention.

Subsequently, $SiO_2$ is deposited, and an ion implantation mask is formed using the ordinary lithography method. The impurity region 8 is formed by proton injection, and the current confinement region 9 is formed in a portion in which ion implantation is not conducted. Here, the diameter of the current confinement region 9 is a design item of the lateral mode. Typically, however, a value in the range of 4 μm to 10 μm becomes a proper value. It is desirable to limit the proton injection only within the surface side semiconductor multilayer film reflecting mirror layer 6 in order to reduce the influence of damage caused by the injection upon the active layer 4. However, the proton injection may reach the inside of the surface side clad layer 5. Specifically in the present example, the proton injection is conducted under the condition that the position of the concentration peak is at a distance of 2 μm from the surface. In this case, the tip of the injection is at a distance of 2.5 μm from the surface. As for the proton injection, however, the process error is approximately 3%. Therefore, there is a possibility that the tip of the actual proton injection will be formed in a low refractive-index $Al_yGa_{1-y}As$ (y=0.95) layer in the semiconductor multilayer film reflecting mirror layer 6 located nearest the active layer 4 or will reach inside of the surface clad layer 3. FIG. 7 shows a configuration of a surface emitting type laser according to a variant of the present example in which the proton injection reaches the surface side clad layer 5. In this variant, the impurity region 8 formed by the proton injection reaches the clad layer 5.

In order to suppress the current spread in the light emitting region layer 4, restrictions are imposed on the position and manufacturing method of the impurity region 8, in which the current confinement region 9 is formed, using the proton injection. The restrictions will now be described.

When carriers flow from a low Al composition AlGaAs layer in the surface side semiconductor multilayer film reflecting mirror layer 6 to a high Al composition AlGaAs layer, there is a potential barrier and the carriers are apt to spread in the lateral direction. It is necessary to provide a high resistance region in the lateral direction to a hetero junction across which carriers flow from the low Al composition AlGaAs layer to the high Al composition AlGaAs layer, to reduce the influence of the carrier spread. For effectively preventing the current injected into the active layer 4 by the impurity region 8 from spreading, it becomes important to provide the impurity region (high resistance region) 8 in the lateral direction as far as a hetero junction across which carriers flow from a low Al composition AlGaAs layer located near the impurity region 8 as far as possible to a high Al composition AlGaAs layer and thereby suppress the current spread in the lateral direction. It is necessary in the surface emitting type laser to set the distance between the high Al composition AlGaAs layer in the semiconductor multilayer film reflecting mirror layer 6 located nearest the active layer 4 and the center of the active layer 4 equal to an integer times λ (wavelength)/2 n in order to form an etalon structure, where λ is the wavelength of generated light, and n is the refractive index of the AlGaAs layer. The distance to the hetero junction across which carriers flow from the low Al composition AlGaAs layer to the high Al composition AlGaAs layer becomes a value obtained by adding λ/4 n to the above-described value (integer times λ/2 n). As ion implantation conditions, therefore, it becomes necessary that the concentration of implanted ions is low in the light emitting region layer to reduce the damage on the light emitting region layer and the ion implantation concentration is high and the current spread in the lateral direction can be restricted in positions each located at a distance greater than λ/2×an integer (1 or more)+λ/4 from the light emitting region layer.

In a GaInP laser having a light emitting wavelength of 650 nm, protons are injected at an injection voltage in the range of 150 keV to 700 keV. As a result, the injection depth is in the range of 1.5 µm to 3.5 µm from the crystal surface from which ion implantation is conducted. At this time, the peak is present, under a certain condition, in a low Al composition AlGaAs layer of a hetero junction across which carriers flow from a fifth low Al composition AlGaAs layer viewed from the active layer to a high Al composition AlGaAs layer. It is desirable to select such a condition. If such a condition is satisfied, then high resistance is implemented on the surface side including a hetero junction across which carriers flow from the low Al composition AlGaAs layer located nearest the active layer to a high Al composition AlGaAs layer, and few protons are injected into the active layer. As for the concentration peak and spread of protons injected into GaAs, it is known that the spread is 0.32 µm when the injection depth is 0.43 µm, the spread is 0.43 µm when the injection depth is 1 µm, the spread is 0.48 µm when the injection depth is 1.5 µm, the spread is 0.5 µm when the injection depth is 2 µm, the spread is 0.52 µm when the injection depth is 2.2 µm, and the spread is 0.59 µm when the injection depth is 3.5 µm. In order to satisfy the above-described condition, therefore, protons are injected under the condition of injection voltage in the range of 150 keV to 700 keV to bring the injection depth into the range of 1.5 µm to 3.5 µm from the crystal surface from which ion implantation is conducted. The tip of the injected protons has a spread in the range of 0.48 µm to 0.59 µm as compared with the proton concentration peak. If both the implantation depth of the ion implantation and the crystal thickness are adjusted, the above-described condition can be satisfied. Conversely, for forming the tip of the ion implantation in a predetermined position, it is necessary that the error of the tip position is in a predetermined range. Only when the peak of proton injection concentration and tip spread are controlled to fall in the range of 0.48 µm to 0.59 µm, therefore, it is possible to satisfy the condition "the peak is present in a low Al composition AlGaAs layer of the hetero junction across which carriers flow from a fifth low Al composition AlGaAs layer viewed from the active layer to a high Al composition AlGaAs layer, and high resistance is implemented on the surface side including a hetero junction across which carriers flow from the low Al composition AlGaAs layer located nearest the active layer to a high Al composition AlGaAs layer."

Here, as for the distance from the peak tip of ion implantation, a distance at which the average concentration becomes small as compared with the peak by one digit or more and the effect of ion implantation becomes small is considered.

The leak of current from low-resistance AlGaAs having a small band gap is efficiently suppressed by thus bringing the peak of ion implantation into the inside of the AlGaAs layer having a low Al composition.

Subsequently, $SiO_2$ is removed using an ammonium fluorate solution. Thereafter, the semiconductor current diffusion layer 7 and the contact layer 7a are formed on the semiconductor multilayer film reflecting mirror 6. If the semiconductor current diffusion layer 7 and the contact layer 7a are formed using the vapor growth method, for example, the MOCVD method can be used. If they are formed using the vapor growth method, the vapor phase etching quantity on the crystal surface before the growth is small as compared with the optical thickness of each layer. Even if they are formed using regrowth, therefore, a film having a designed thickness can be formed.

If the semiconductor current diffusion layer 7 and the contact layer 7a are to be formed using a semiconductor junction, the contact layer 7a and the semiconductor current diffusion layer 7 are formed on a second GaAs substrate in the cited order. The semiconductor current diffusion layer 7 is opposed to the surface side semiconductor multilayer film reflecting mirror layer 6 and brought into contact with it. A pressure of several MPa is applied in the atmosphere of arsine, and annealing is conducted at a temperature in the range of approximately 650° C. to 850° C. Junction is conducted using such a method, and then a portion located on the second substrate side than the contact layer 7a on the second GaAs substrate is removed by etching. For example, a GaInP layer having a thickness of several µm is grown on the second substrate, and then the GaAs contact layer 7a is formed. If a hydrogen peroxide sulfate etchant is used, the etching speed in the GaInP layer is different from that in GaAs. Therefore, only the GaAs substrate can be removed using the GaInP layer as an etching stop layer. Thereafter, a hydrochloric acid etchant which does not etch GaAs is used. As a result, the GaInP layer can be removed to expose the surface of the GaAs contact layer 7a.

In this way, the semiconductor current diffusion layer 7 and the contact layer 7a are formed using vapor phase growth or semiconductor junction. Thereafter, a portion corresponding to the contact region 11a having an inside diameter which is 3 µm greater than the outside diameter of the current confinement region 9 formed by ion implantation and a width of 10 µm is removed. Pattern etching is conducted on the contact layer 7a with a process margin of 0.75 µm. Subsequently, the passivation film 10 formed of $SiO_2$ is deposited. An opening for forming the contact region 11a is provided in the passivation film 10 with a process margin of 1 µm and a width of 7 µm by using lithography.

Thereafter, the Ti/Pt/Au surface side electrode 11 is vapor-deposited while leaving the opening portion 12 for laser light. The p-side electrode having an ohmic junction in the contact region 11a is thus formed. Here, the process margin at the time when forming the opening portion is set to 0.75 µm. Further thereafter, the surface side electrode 13 of AuGeNi/Au is vapor-deposited to form the n-type electrode.

Even if the lithography is conducted with the ordinary precision of ±0.75 µm in the fabrication process of the surface emitting type laser in the present example, the opening portion 12 of the electrode does not overlap the current confinement region 9 and characteristics of the surface emitting type laser are not affected remarkably. If a surface emitting type laser of ion implantation type that does not use the present example is fabricated with a current confinement region diameter of 4 µm and a process precision of 0.75 µm as in the present example, then the current required to obtain the same optical output varies by 60% or more according to the controllability of the aperture of the opening 12 of the electrode 11, and it is extremely difficult to obtain devices having uniform characteristics with high reproducibility.

Thus, the present example is excellent in that a surface emitting type laser having a small aperture, a low threshold and high optical mode stability can be implemented with high reproducibility and uniformity as a surface emitting type laser of ion implantation type having high reliability as compared with a surface emitting type laser of oxide type.

THIRD EXAMPLE

A surface emitting type laser according to a third example of the present invention will now be described with reference to FIG. 6. The surface emitting type laser according to this example is the same as the surface emitting type laser according to the first example except that protons are injected after the surface side semiconductor multilayer film reflecting mirror layer 6 is grown halfway by 2 μm and thereafter an upper part 6a of the surface side semiconductor multilayer film reflecting mirror layer having a thickness of 1.2 μm, the semiconductor current diffusion layer 7 and the contact layer 7a are formed by vapor growth or adhesion. As regards other points including the manufacturing method, there are no remarkable differences from the first and second examples.

In the surface emitting type laser having such a structure, it is possible to make the proton injection depth shallow, control the proton concentration accurately as far as the vicinity of the active layer 4, and efficiently form current confining paths. As a result, the operation current value, especially the oscillation threshold of the laser can be made small. In the case of the present example, the total film thickness of the surface side multilayer film reflecting mirror layers 6 and 6a becomes 3.2 μm. If in this case the proton injection is conducted with the tip depth of ion implantation from the surface of the surface side multilayer film reflecting mirror layer 6 being set to 3 μm, then the distance between the impurity region 8 and the light emitting region layer 4 becomes 0.2 μm. If the diameter of the current confinement region is set equal to 3 μm, the spread diameter of the light emitting region spreads to 3.4 μm.

If the present example is used, however, ion implantation can be conducted up to within 0.1 μm from the semiconductor active layer 4 by growing the semiconductor current diffusion layer 6 by 2 μm and then conducting ion implantation under the condition that the tip of the ion implantation reaches a depth of 2 μm. Thus it is possible to substantially square the diameter of the current confinement region 9 with the current injection diameter at the active layer 4. Furthermore, since the ion implantation depth can be made shallow, the control precision of the diameter of the current confinement region 9 can also be raised.

When obtaining laser light of 1.3 μm using a GaAs/GaInNAs/GaAs quantum well, the surface side multilayer film reflecting mirror layer is formed by laminating fifty $Al_qGa_{1-q}As$ layers (q=0.95, thickness of 111 nm) having a low refractive index and fifty $Al_sGa_{1-s}As$ layers (s=0.5, thickness of 104 nm) having a high refractive index alternately. The total thickness of the surface side multiplayer film reflecting mirror layer becomes 5.4 μm according to the wavelength change. Even if in this case ion implantation is conducted under the condition that the peak of the ion concentration occurs at a depth of 3 μm from the surface of the surface side semiconductor multilayer film reflecting mirror layer, the influence of the current spread between the ion implantation tip and the active layer is great. Even if the diameter of the current confinement region is set to 3 μm, the current diameter in the active layer becomes approximately 7.8 μm. Therefore, it is extremely difficult to control the device characteristics.

On the other hand, the surface side semiconductor multilayer film reflecting mirror layer 6 is grown by 2 μm using the structure of the present example. At this stage, ion implantation is conducted to form the current confinement region 9 under the condition that the concentration peak position of impurity ions (for example, protons) becomes 1.5 μm. If the upper part 6b of the surface side multilayer film reflecting mirror is formed thereafter, the extension of the diameter of the current confinement region 9 and the current spread diameter in the light emitting region layer 4 can be made extremely small, i.e., within 0.3 μm. As a result, a surface emitting type laser capable of conducting low threshold operation and having high mode stability is obtained.

For raising the current confining path effect, thereby suppressing the current spread in the active layer 4, and implementing the low current operation of the surface emitting type laser in the same way as the first embodiment, restrictions are imposed on the condition of proton injection. If protons are injected at an injection voltage in the range of 50 keV to 400 keV, the concentration peak of protons occurs in the position in the range of 0.4 μm to 2.2 μm. At this time, the tip portion of injection is formed in a position in the range of 0.33 μm to 0.54 μm from the peak. In the 1.3 μm band GaInAs quantum well laser, λ/n is approximately 0.43 μm. The peak of proton concentration is formed in a low Al composition AlGaAs layer of a hetero junction across which carriers flow from a second low Al composition AlGaAs layer viewed from the active layer 4 to a high Al composition AlGaAs layer. As a result, high resistance is implemented on the side part of a hetero junction across which carriers flow from the low Al composition AlGaAs layer located nearest the active layer 4 to a high Al composition AlGaAs layer. Thus, it is possible to prevent ions of high concentration from reaching the active layer 4. In the device of the present example, ion implantation is conducted under this condition. As a second condition, protons are injected with energy in the range of lb 400 keV to 500 keV, and the peak position of the proton concentration is in the range of 2.2 μm to 2.6 μm. At this time, the tip of the injected protons appears in a position that is 0.54 μm to 0.56 μm deeper than the position at which the concentration reaches its peak. If a condition is selected in proton injection so as to form the peak of proton concentration in a low Al composition AlGaAs layer of a hetero junction across which carriers flow from a third low Al composition AlGaAs layer viewed from the active layer 4 to a high Al composition AlGaAs layer, then high resistance is implemented on the side part of a hetero junction across which carriers flow from the low Al composition AlGaAs layer located nearest the light emitting region layer 4 to a high Al composition AlGaAs layer. In addition, it is possible to prevent high concentration protons from reaching the active layer 4. In the present example, injection is conducted under the condition that the depth of the peak of the ion implantation which is a first range becomes 1.5 μm.

In the case of a 1.3 μm band surface emitting type laser using a GaInNAs/GaAs quantum well, laser light having a longer wavelength than the absorption edge of GaAs is used and consequently absorption conducted by GaAs is weak. In the substrate side semiconductor multilayer film reflecting mirror layer 2 and the surface side semiconductor multilayer film reflecting mirror layer 6, therefore, a laminated structure composed of AlGaAs and GaAs or a laminated structure composed of GaAs and AlGaAs can be used. GaAs can be used in the clad layers 3 and 5, and GaAs can be used in the semiconductor current diffusion layer 7. In this case, the contact layer 7a is obtained only by raising the impurity concentration on the surface side of the semiconductor current diffusion layer 7.

Furthermore, a GaAs layer can be used within the surface side semiconductor multiplayer film reflecting mirror layer 6. After the surface side semiconductor multilayer film reflecting mirror layer 6 is grown halfway and ion implantation is conducted, therefore, a regrowth interface obtained when the upper part 6b of the surface side semiconductor multilayer film reflecting mirror layer 6b is grown or an adhesion plane can be provided as an interface within the GaAs layer. An interface having high reproducibility and fine characteristics can be formed by using GaAs which is two-dimensional crystal as the interface.

The method for forming the surface emitting type laser shown in FIG. 6 can be executed nearly in the same way as the surface emitting type laser of the first example. If a GaInNAs/GaAs quantum well is formed using the metal organic chemical vapor deposition method, tertiary butyl arsine (TBA) may also be used as a raw material for As besides arsine ($AsH_3$). As a raw material for nitrogen, dimethylhydrazine (DMHy) or a combination of dimethylhydrazine (DMHy) and ammonia gas ($NH_3$) may be used.

FOURTH EXAMPLE

A surface emitting type laser according to a fourth example of the present invention will now be described. The surface emitting type laser in this example is a surface emitting type laser according to the sixth embodiment. In the present example, especially the thickness s of the semiconductor current diffusion layer 7 is prescribed in relations to the diameter r of the current confinement region 9. If the diameter of the current confinement region 9 is set equal to 8 µm which is desirable when bringing the device into operation in the single mode and the thickness of the semiconductor current diffusion layer 7 is set equal to 2 µm, then this device satisfy the relation $5 \times \sqrt{r} > s$ and consequently the resistance in the longitudinal direction becomes small as compared with the electrode resistance.

Furthermore, the relation $s > ((\sqrt{2}-1)/2) \times r$ is satisfied. Therefore, the electrode resistance can be lowered and uniform current injection becomes possible. The relation of the longitudinal to lateral resistance ratio will now be described in detail.

If the carrier concentration of the $Al_{0.6}Ga_{0.4}As$ semiconductor current diffusion layer 7 is set equal to $5 \times 10^{17}$ cm$^{-3}$, then the resistivity is approximately 0.12 Ω·cm.

Since the resistance in the longitudinal direction is expressed as 2 µm/(π×(4 µm×4 µm)×resistivity, it becomes approximately 45 ohms. Since the resistance in the lateral direction is expressed as 2 µm/2/(2×π×(4 µm+1 µm)×2 µm)× resistivity, it becomes approximately 38 ohms. Actually, the resistance in the lateral direction becomes small.

In the case where the current spreads from the electrode to the current confinement region, therefore, the ratio between the current density spreading to the outer peripheral part of the current confinement region and the current density spreading to the central part of the current confinement region can be held down to two or less. In addition, owing to the effect of the resistance at the hetero junction of the multilayer film reflecting mirror layer in the current confinement region and the current spread within the active layer, the uniformity of the current density within the active layer is improved and it becomes possible to obtain a uniform optical output. A semiconductor surface emitting type laser having mode stability can be obtained.

If ion implantation is conducted on the way of forming the surface side semiconductor multilayer film reflecting mirror layer 6 and the upper part 6a of the surface side semiconductor multilayer film reflecting mirror layer is formed on the surface side semiconductor multilayer film reflecting mirror layer 6 as in the surface emitting type laser according to the third example, then the total thickness of the upper part 6a of the surface side semiconductor multilayer film reflecting mirror layer and the semiconductor current diffusion layer 7 can be regarded as s.

FIFTH EXAMPLE

A surface emitting type laser according to a fifth example of the present invention will be described with reference to FIGS. 1 and 2.

In the surface emitting type laser according to the present example, the diameter of the central current confinement region 9a is 5 µm and the diameter of each of total twelve current confinement regions 9b formed in two rows around the central current confinement region 9a is 4 µm. The distance between centers of current confinement regions is 6 µm. The distance between ends of the central current confinement region 9a and peripheral current confinement regions 9b is 1.5 µm. The distance between ends of peripheral current confinement regions is 2 µm. The contact region 11a is provided outside all current confinement regions, and the contact region 11a has an inside diameter of 16 µm. This surface emitting type laser includes a substrate side semiconductor multilayer film reflecting mirror layer 2 obtained by laminating fifty $Al_qGa_{1-q}As$ (q=0.9) layers and fifty $Al_sGa_{1-s}As$ (s=0.5) layers alternately on an n-type GaAs substrate 1, an n-conductivity type substrate side clad layer 3 formed of $In_{0.5}(Ga_{0.3}Al_{0.7})_{0.5}P$, a semiconductor active layer 4 including a light emitting region, which includes InGaP quantum wells and $In_{0.5}(Ga_{0.5}Al_{0.5})_{0.5}P$ quantum well barriers and which has a light emitting wavelength of 650 nm, a p-conductivity type surface side clad layer 5 having a thickness of 110 nm formed of $In_{0.5}(Ga_{0.3}Al_{0.7})_{0.5}P$, and a surface side semiconductor multilayer film reflecting mirror layer 6 having a thickness of 2.58 µm obtained by laminating twenty-six $Al_sGa_{1-s}As$ (s=0.5) layers and twenty-six $Al_qGa_{1-q}As$ (q=0.95) layers alternately.

In addition, a semiconductor current diffusion layer 7 having a thickness of 12 µm formed of $Al_aGa_{1-a}As$ (a=0.5) is formed on the surface side semiconductor multilayer film reflecting mirror 6. A contact layer 7a formed of GaAs is formed on a part of the top of the semiconductor current diffusion layer 7. Here, the semiconductor current diffusion layer 7 has a carrier concentration of $1 \times 10^{18}$ cm$^{-3}$, and the contact layer 7a has a carrier concentration of $1 \times 10^{19}$ cm$^{-3}$. A high resistance region 8 is formed in the surface side semiconductor multilayer film reflecting mirror layer 6 by proton injection under the condition that the peak depth becomes 2.05 µm. A current confinement region 9 is formed by the high resistance region 8. A $SiO_2$ passivation film 10 is formed on a part of the surface of the contact layer 7a and the surface of the semiconductor current diffusion layer 7 except the contact layer 7a. In addition, a surface side electrode 11 formed of Ti/Pt/Au is formed so as to come in contact with the contact layer 7a in a contact region 11a. The contact region 11a has a width of 10 µm. A current injected from the surface side electrode 11 is confined in path by the current confinement region 9 via the contact layer 7a and the semiconductor current diffusion layer 7, and injected into the active layer 4. An opening portion 12 is provided in the surface side electrode 11 and inside the contact region. Laser light is taken out from this portion. A substrate side electrode metal 13 formed of AuGaNi/Au is formed on the back of the substrate 1. Carriers supplied from the substrate side electrode metal 13 are injected into the active layer 4 via the substrate side semiconductor multilayer film reflecting mirror 2.

In the present example, the outside diameter of the high optical density region in the light emitting region 4 formed by the current confinement region 9 depends on the distance between the center of the whole device and an outermost point of a current confinement region in the outer row, and it is 14 µm. The inside diameter of the electrode is 16 µm.

In the present example, the radius r of a circle that circumscribes outermost circumferences of current confinement regions and has the center of the current injection region as its center is 14 μm. The thickness s of the semiconductor current diffusion layer 7 is 12 μm. Therefore, the relation (($\sqrt{2}-1$)/2)× r<5×$\sqrt{r}$ is satisfied. This corresponds to the first embodiment with the expressions (2) and (3) described with reference to the sixth embodiment being applied thereto. Therefore, uniform current injection to the current confinement regions becomes possible.

The method for fabricating the device according to the present example is nearly the same as the fabricating method for the device according to the first example except that a plurality of current confined regions are formed by proton injection and all of a region of the contact layer left by the selective etching, the contact region, and the electrode are formed nearly outside the general outer circumference of a plurality of current confinement regions.

If the device in the present example is driven at a current value of 50 mA, laser oscillation occurs. At this time, the ratio among the optical density in the current confinement region in the central part, the optical density at a radius corresponding to the current confinement regions in the inner row, and the optical density at a radius corresponding to the current confinement regions on the outermost circumference becomes approximately 5:4:4. The optical density is slightly high in the center, and a uniform profile is obtained outside the center. The operation voltage at this time becomes 2 V. On the other hand, if a device having a thickness of the semiconductor current diffusion layer set equal to 3 μm is driven at a current value of 50 mA, the ratio among the optical density in the central part, the optical density at the radius corresponding to the current confinement regions in the inner row, and the optical density at the radius corresponding to the current confinement regions on the outermost circumference becomes approximately 1:2:5. A profile having a high optical density in the outer circumference part is obtained. The operation voltage at this time becomes 3.7 V.

If the thickness of the semiconductor current diffusion layer 7 is set equal to 12 μm, which is larger than the radius 7 μm of the outermost circumference of the current confinement regions and the inside diameter 8 μm of the electrode, as in the present embodiment, then the resistance to the current flowing in the surface direction of the substrate decreases. Even if the current confinement regions are away from the electrode, therefore, the current is spread and injected into the current confinement regions uniformly. The optical density becomes uniform, and the resistance becomes low.

On the other hand, in a device in a comparative example having a thickness 3 μm of the semiconductor current diffusion layer 7 which is less than the inside diameter 8 μm of the electrode, the current does not spread sufficiently in the lateral direction and flows into the current confinement regions in the outer circumference part, resulting in non-uniform operation.

In the present example, there are a plurality of current confinement regions 9 and the semiconductor current diffusion layer 7 that is thicker than the inside diameter of the electrode 11 is included. Therefore, the thickness of the current diffusion layer 7 is larger than the diameter of a single current diffusion region 9.

The device of the present example coincides in total area of the current confinement regions with a device having a radius of 14.7 μm. As compared with a device having a radius of approximately 8 μm, therefore, the linearity of the optical output as a function of the injection current is high and the maximum optical output can be increased to three times or more. Furthermore, since the current confinement region is partitioned, current non-uniformity in the current confining path region is not apt to occur. Especially, in the device of the present example, the thickness 2.48 μm of the semiconductor multilayer film reflecting mirror layer is larger than the radius of each current confinement region in the range of 2 μm to 2.5 μm. Thus, the current uniformity in the current confinement regions is high. Even if the device is made to operate with a high output, the optical mode stability is high.

Owing to that the current injection region is scattered and the current injection region is uniform, the device resistance becomes low, the temperature change of the device is small when the optical output is increased, and the wavelength stability is high when the optical output is changed. When the device is put into operation with the same optical output, the device operates in a state in which the carrier density in the active layer 4 is low. Therefore, an increase of invalid carriers caused by a rise of the ambient temperature is slight and device characteristics are stable.

In the example, a current confinement region having a diameter of 5 μm is disposed in the center of the device, and six current confinement regions each having a diameter of 4 μm are disposed on each of circumferences (rows) respectively having radii of 6 μm and 12 μm. However, the arrangement of the current confinement regions is not restricted to such an arrangement. For example, current confinement regions may be disposed in the center and on one circumference. Even if current confinement regions are disposed on two circumferences, current confinement regions may be disposed on an outer circumference at angles different from those on an inner circumference. The number and size of current confinement regions on the outer circumference may be different from those on the inner circumference. The number of circumferences (rows) may be increased. As a matter of course, the interval may be changed, and the interval may be made non-uniform. Current confinement regions may be disposed on a square lattice. Current confinement regions may be disposed on a hexagon lattice. The current confinement region in the center may be removed. For example, three current confinement regions may be on a triangle. If five or less current confinement regions are arranged on one row, then the size of the whole device can be made small and consequently the arrangement is advantageous in improving high frequency characteristics.

SIXTH EXAMPLE

A surface emitting type laser according to a sixth example of the present invention will now be described with reference to FIG. 4B.

The surface emitting type laser according to the present example has the same configuration as that of the surface emitting type laser according to the fifth example except that the semiconductor current diffusion layer 7 is formed in a restricted region having a diameter of 26 μm and a SiO$_2$ mask 16 is provided outside the restricted region.

Furthermore, in the light emitting laser according to the present example, the semiconductor current diffusion layer includes a plurality of layers. A current uniformizing region layer 71 is provided on the lower side. A low resistance region layer 72 is provided on the upper side. The current uniformizing region layer has a low carrier concentration, a large thickness, and high resistance in the peripheral part. The low resistance region layer 72 in the semiconductor current diffusion layer has a thickness of approximately 11 μm and a carrier concentration of 1×10$^{18}$ cm$^{-3}$. The current uniformizing region layer 71 in the semiconductor current diffusion layer has a thickness of approximately 1 μm and a carrier concentration of $1\times10^{16}$ cm$^{-3}$ on the outer side, and has a thickness of approximately 0.3 µm and a carrier concentration of $3\times10^{16}$ cm$^{-3}$ in the central part. The contact layer 7a and the contact region 11a are respectively 5 µm and 3 µm in width.

The surface emitting type laser device according to the present example is produced using a method similar to the method for the surface emitting type laser device of the fifth example. However, there is a feature in a method for forming the semiconductor current diffusion layer 7. Before the semiconductor current diffusion layer 7 is formed, the SiO$_2$ mask 16 is deposited on the semiconductor multilayer film reflecting mirror layer 6. Patterning is conducted on the SiO$_2$ mask 16 to form an opening portion having a diameter of 30 µm and corresponding to the semiconductor current diffusion layer 7. A semiconductor current diffusion layer is formed using the SiO$_2$ mask 16 as a selective growth mask and using the metal organic chemical vapor deposition method in the same way as the first example. When forming the current uniformizing region layer 71, growth is conducted at a growth temperature of 620° C. to 650° C. and normal pressure. Under this growth condition, the growth rate is affected greatly by the selective growth mask 16. Therefore, the growth rate becomes great in an outer periphery part located near the selective growth mask 16. On the other hand, in the central part, the effect of the selective growth mask 16 is slight and the growth rate becomes a small value and definite. Here, zinc is used as p-type impurities, and dimethyl zinc (DMZn) is used as a raw material. Zinc is a II-group element and taken into a III-group site. Therefore, site competition with a III-group element occurs. If the growth rate increases, the addition efficiency falls. As a result of the selective growth, the surface concentration and the crystal growth rate are increased by diffusion of a raw material on the mask, in the III-group element having a high raw material taken-in efficiency. In the II-group raw material gas having a low raw material taken-in efficiency, however, there is little influence of the selective growth. In the vicinity of the selective growth mask, therefore, the growth rate is high and the impurity concentration can be made low. At a distance from the selective growth mask, the growth rate becomes an ordinary value and the impurity concentration also becomes an ordinary value. As p-type impurities, Zn may be used by using dimethyl zinc (DEZn) as a raw material. Or Mg may be used by using cyclopentadienyl magnesium (C$_{p2}$Mg) as a raw material. Or Cd may be used by using dimethyl cadmium (DMCd) or diethyl cadmium (DECd) as a raw material.

Furthermore, in the case where the conductivity type in the present example is reversed and an n-conductivity type semiconductor current diffusion layer is used as the semiconductor current diffusion layer, similar effects can be obtained even if Si is added using SiH$_4$ or Si$_2$H$_6$. The low resistance region layer 72 is grown on the current uniformizing region layer 71 at 50 Torr and 700° C. By lowering the growth pressure, the diffusion distance of the raw material gas extends and the distribution of the growth rate caused by the selective growth mask becomes small. In the low resistance region layer 72, the pressure is approximately 1/15 as compared with the current uniformizing region layer 71 and the thickness distribution can be made 10% or less. As a result, the carrier concentration distribution can also be made 10% or less, and the resistivity distribution can be made 10% or less.

If the device of the present example is driven with a current value of 50 mA, laser oscillation is caused. At this time, the ratio among the optical density in the current confinement region in the central part, the optical density at a radius corresponding to the current confinement regions in the inner row, and the optical density at a radius corresponding to the current confinement regions on the outermost circumference becomes approximately 3:2:1.5. The optical density is high in the center, and a weak profile is obtained outside the center. The operation voltage at this time becomes 2.5 V.

In the surface emitting type laser according to the present example, the current density can be uniformized by providing the current uniformizing layer 71 in the semiconductor current diffusion layer 7, as compared with the surface emitting type laser according to the fifth example. In the outer circumference portion of the device having a small area ratio in current confinement region, therefore, the optical output density becomes low. In the central part of the device, the optical output density becomes high. As compared with the surface emitting type laser according to the fifth example, the device resistance is slightly increased by providing the current uniformizing layer 71. However, the increase of the device resistance is restrictive because the current is injected uniformly in a large device.

In the device of the present example, the current injection density is high and the optical density is high in the device center. Therefore, the device can easily operate in the optical fundamental mode. Even if the device is brought into high frequency operation, the mode variation is not apt to occur.

In the present example, the current uniformizing region layer 71 in the semiconductor current diffusion layer 7 is formed by selective growth. Alternatively, it is also possible to form the current uniformizing region layer beforehand, then remove its central part at least halfway by patterning and etching, make the central part thin, and form the low resistance region layer 72. Unlike the above-described example in which the current uniformizing region layer 71 is formed by selective growth, the carrier concentration distribution cannot be caused in the current uniformizing region layer 71 by using only patterning and etching. However, the thickness distribution can be made great freely. Therefore, controllability concerning the distribution of resistance in the longitudinal direction of the current uniformizing region layer which depends on the product of the resistivity and the thickness.

As the first to sixth examples, the present invention is applied to the surface emitting type laser. However, the present invention is not restricted to the surface emitting type laser. It is a matter of course that the present invention can also be applied to resonant light emitting device having a semiconductor multilayer film structure. The present invention can be applied to a surface emitting type optical semiconductor device having a semiconductor multilayer film reflecting mirror without departing the spirit of the present invention.

As for the material as well, the present invention is not restricted to an AlGaAs/GaAs semiconductor multilayer film. The present invention can be applied to a surface emitting type optical semiconductor device including a semiconductor multilayer film which uses a GaAlInP/GaIn(Al)P material, an In(Al)GaAs/AlGaInAs material, an InP/AlGaInAs material, an InP/GaInAsP material, or an AlGaAs/GaAs material, or a surface emitting type optical semiconductor device including a semiconductor multilayer film reflecting mirror which uses a semiconductor combination obtained by adding N or Sb to the above-described material, a combination of GaSb and InAs, a combination of GaSb and GaAlSb, or a semiconductor combination obtained by adding a III-group element or a V-group element to these materials serving as the base.

According to embodiments of the present invention, it becomes possible as heretofore described to provide a surface emitting type semiconductor light emitting device capable of suppressing the leak current to the outside of the device, attaining improvements in lowered threshold, fast response and mass productivity, attaining improvements in an unoxidized region generated by anisotropic oxidation, the shape of the output beam pattern, and mode control, mitigating the compressive stress applied to the light emitting region by volume contraction caused when oxidizing the high Al concentration layer, suppressing cracks and damages on the interface, raising the tolerance to the thermal process conducted after the selective oxidation process, improving the device reliability, and prolonging the life.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A surface emitting type optical semiconductor device comprising:
   a substrate;
   a first reflecting mirror layer provided on the substrate and having a first semiconductor multilayer film;
   a semiconductor active layer provided above the first reflecting mirror layer and having a light emitting region;
   a second reflecting mirror layer provided above the semiconductor active layer and having a second semiconductor multilayer film, the first and second reflecting mirror layers forming an optical cavity in a direction perpendicular to the substrate;
   a current confinement region provided in the second reflecting mirror layer so as to be surrounded by an impurity region having impurities, the current confinement region having current confining paths;
   a semiconductor current diffusion layer provided on the second reflecting mirror layer so as to cover the current confinement region, the semiconductor current diffusion layer having a stacked structure of first and second semiconductor current diffusion films, the first semiconductor current diffusion film being located nearer the semiconductor active layer than the second semiconductor current diffusion film, the first semiconductor current diffusion film being formed so as to have a greater thickness in a peripheral part located far from a center of the current confinement region as compared with a central part located near the center of the current confinement region, the second semiconductor current diffusion film having a higher carrier concentration than that of the peripheral part of the first semiconductor current diffusion film; and
   an electrode portion which injects a current into the semiconductor active layer, the electrode portion comprising a first electrode provided on the semiconductor current diffusion layer so as to surround the current confinement region and a second electrode provided on an opposite side of the substrate from the semiconductor active layer.

2. The surface emitting type optical semiconductor device according to claim 1, wherein the current confinement region comprises a plurality of regions.

3. The surface emitting type optical semiconductor device according to claim 2, wherein the current confinement regions are arranged so as to increase in device resistance for injecting currents with the increase of the distance from a center of a region surrounding the current confinement regions toward outside.

4. The surface emitting type optical semiconductor device according to claim 1, wherein a minimal radius r μm of the current confinement region and a film thickness s μm of the semiconductor current diffusion layer satisfy relations $$s < 5\sqrt{r}$$

and $$s > ((\sqrt{2}-1)/2) \times r.$$

5. The surface emitting type optical semiconductor device according to claim 1, wherein a thickness of the impurity region is greater than a minimal radius of the current confinement region.

6. The surface emitting type optical semiconductor device according to claim 1, wherein the semiconductor current diffusion layer is provided so as to be in contact with the current confinement region.

7. The surface emitting type optical semiconductor device according to claim 1, wherein a third reflecting mirror layer having a third semiconductor multilayer film is provided between the semiconductor current diffusion layer and the second reflecting mirror layer.

* * * * *